United States Patent
Kingman et al.

(10) Patent No.: US 10,562,274 B1
(45) Date of Patent: Feb. 18, 2020

(54) GLASS FASTENING AND SEALING SYSTEMS

(71) Applicants: David E. Kingman, Campbell, CA (US); Derek C. Scott, Santa Clara, CA (US); Donald R. Monroe, Los Gatos, CA (US); Phil M. Hobson, Sunnyvale, CA (US); Juan A. Lazaro, San Jose, CA (US); Ibuki Kamei, Santa Clara, CA (US); John Raff, Menlo Park, CA (US); Stephen B. Lynch, Sunnyvale, CA (US); Albert J. Golko, Saratoga, CA (US); Christopher D. Prest, Sunnyvale, CA (US); Dale N. Memering, San Francisco, CA (US); James A. Yurko, Saratoga, CA (US); Christopher D. Jones, Los Gatos, CA (US)

(72) Inventors: David E. Kingman, Campbell, CA (US); Derek C. Scott, Santa Clara, CA (US); Donald R. Monroe, Los Gatos, CA (US); Phil M. Hobson, Sunnyvale, CA (US); Juan A. Lazaro, San Jose, CA (US); Ibuki Kamei, Santa Clara, CA (US); John Raff, Menlo Park, CA (US); Stephen B. Lynch, Sunnyvale, CA (US); Albert J. Golko, Saratoga, CA (US); Christopher D. Prest, Sunnyvale, CA (US); Dale N. Memering, San Francisco, CA (US); James A. Yurko, Saratoga, CA (US); Christopher D. Jones, Los Gatos, CA (US)

(73) Assignee: APPLE INC., Cupertino, CA (US)

( * ) Notice: Subject to any disclaimer, the term of this patent is extended or adjusted under 35 U.S.C. 154(b) by 149 days.

(21) Appl. No.: 15/437,996

(22) Filed: Feb. 21, 2017

Related U.S. Application Data

(60) Provisional application No. 62/298,143, filed on Feb. 22, 2016.

(51) Int. Cl.
*B32B 3/06* (2006.01)
*B32B 3/24* (2006.01)
(Continued)

(52) U.S. Cl.
CPC .......... *B32B 17/10293* (2013.01); *B32B 3/06* (2013.01); *B32B 3/266* (2013.01);
(Continued)

(58) Field of Classification Search
None
See application file for complete search history.

(56) References Cited

U.S. PATENT DOCUMENTS 2,125,372 A * 8/1938 Fox ................. C03B 23/245
52/204.52
2,302,740 A * 11/1942 Boicey ............... B64C 1/1492
52/204.52
(Continued)

FOREIGN PATENT DOCUMENTS

AT 506530 A1 * 9/2009 ............. A47F 3/001
CN 102802938 A 11/2012
(Continued)

OTHER PUBLICATIONS

Machine Translation of DE 202004017265 U1, Feb. 2005 (Year: 2005).*
(Continued)

*Primary Examiner* — Jeffrey A Vonch
(74) *Attorney, Agent, or Firm* — Young Basile Hanlon & MacFarlane, P.C.

(57) ABSTRACT

A glass fastening system includes a fastener having a first portion embedded along an interlayer within a laminated
(Continued)

glass portion and a second portion extending outward from an exterior surface of the laminated glass portion for use in attachment to a support structure. Another glass fastening system includes a fastener having a first portion adhered to an exterior surface of a glass pane and a second portion extending from the first portion away from the exterior surface for use in attachment to a support structure. A glass sealing system includes a pair of glass panes having offset edge portions and a seal including an overmold portion capturing the edge portions. Another glass sealing system includes a seal having an internal portion embedded within a laminated glass portion and an external portion extending along an exterior surface of the laminated glass portion.

23 Claims, 11 Drawing Sheets

(51) Int. Cl.
```
       B32B 3/30      (2006.01)
       B32B 7/08      (2019.01)
       B32B 7/12      (2006.01)
       B32B 17/10     (2006.01)
       B60J 1/00      (2006.01)
       H02S 40/34     (2014.01)
       B60Q 1/26      (2006.01)
       B32B 3/26      (2006.01)
       F16B 5/06      (2006.01)
       E06B 3/54      (2006.01)
       B60J 9/00      (2006.01)
       B60R 11/00     (2006.01)
       B60Q 1/00      (2006.01)
       H01L 31/048    (2014.01)
```
(52) U.S. Cl.
CPC .............. *B32B 3/30* (2013.01); *B32B 7/08* (2013.01); *B32B 7/12* (2013.01); *B32B 17/10036* (2013.01); *B32B 17/10165* (2013.01); *B32B 17/1055* (2013.01); *B32B 17/10541* (2013.01); *B32B 2250/03* (2013.01); *B32B 2250/40* (2013.01); *B32B 2307/202* (2013.01); *B32B 2307/412* (2013.01); *B32B 2315/08* (2013.01); *B32B 2457/00* (2013.01); *B32B 2457/12* (2013.01); *B32B 2605/006* (2013.01); *B60J 1/001* (2013.01); *B60J 1/006* (2013.01); *B60J 9/00* (2013.01); *B60Q 1/0023* (2013.01); *B60Q 1/2615* (2013.01); *B60Q 1/2619* (2013.01); *B60R 2011/0021* (2013.01); *B60R 2011/0022* (2013.01); *B60R 2011/0047* (2013.01); *B60Y 2400/216* (2013.01); *E06B 3/5436* (2013.01); *F16B 5/065* (2013.01); *H01L 31/0488* (2013.01); *H02S 40/34* (2014.12); *Y02E 10/47* (2013.01); *Y02E 10/50* (2013.01); *Y10S 428/90* (2013.01); *Y10T 428/24008* (2015.01); *Y10T 428/24182* (2015.01); *Y10T 428/24322* (2015.01); *Y10T 428/24331* (2015.01); *Y10T 428/24339* (2015.01); *Y10T 428/24521* (2015.01); *Y10T 428/24562* (2015.01); *Y10T 428/24612* (2015.01)

(56) References Cited

U.S. PATENT DOCUMENTS

| | | | | |
|---|---|---|---|---|
| 2,359,163 A * | 9/1944 | Sherts | B32B 17/10036 52/204.52 |
| 2,403,060 A * | 7/1946 | Downes | B32B 17/10036 52/208 |
| 2,858,414 A * | 10/1958 | Dash | B23K 35/0288 219/99 |
| 2,936,050 A * | 5/1960 | McLaughlin | B32B 17/10045 52/704 |
| 4,500,572 A * | 2/1985 | Francis | E04D 3/08 428/34 |
| 4,552,790 A * | 11/1985 | Francis | E04D 3/08 428/34 |
| 4,680,206 A * | 7/1987 | Yoxon | E04B 2/90 156/109 |
| 4,793,112 A * | 12/1988 | Sufke | B32B 17/10036 52/309.14 |
| 4,799,346 A * | 1/1989 | Bolton | B32B 17/10036 428/441 |
| 4,891,732 A * | 1/1990 | Jones | F16B 37/044 361/218 |
| 4,893,443 A * | 1/1990 | Haber | E06B 3/5436 52/204.593 |
| 5,027,567 A * | 7/1991 | Roberts | E04D 3/06 52/204.593 |
| 5,138,804 A * | 8/1992 | Roberts | E04D 3/06 52/204.593 |
| 5,152,650 A * | 10/1992 | Kitagawa | B29C 70/12 411/424 |
| 5,391,411 A * | 2/1995 | Rowland | B32B 17/10917 428/34 |
| 5,398,452 A | 3/1995 | Schilde et al. | |
| 5,475,956 A * | 12/1995 | Agrawal | B29C 35/08 296/201 |
| 5,503,684 A * | 4/1996 | Duran | B32B 17/10036 136/251 |
| 5,540,514 A * | 7/1996 | Demars | B32B 17/10036 403/388 |
| 5,760,744 A | 6/1998 | Sauer | |
| 5,787,662 A * | 8/1998 | Danz | B32B 17/10036 52/200 |
| 5,804,719 A * | 9/1998 | Didelot | B32B 17/10036 15/250.12 |
| 5,851,470 A * | 12/1998 | Yokota | B29C 45/14344 264/219 |
| 6,138,434 A * | 10/2000 | Demars | A47F 3/0434 52/786.13 |
| 6,235,984 B1 * | 5/2001 | Wambach | H02S 40/34 136/256 |
| 6,254,397 B1 * | 7/2001 | Elmer | B32B 17/10036 439/6 |
| 6,609,350 B1 * | 8/2003 | Weber | B32B 17/10036 52/784.1 |
| 7,960,854 B2 | 6/2011 | Paulus et al. | |
| 8,427,381 B2 | 4/2013 | Labrot et al. | |
| 8,810,462 B2 | 8/2014 | Goldberger | |
| 2001/0023562 A1 * | 9/2001 | Blobaum | B32B 17/10293 52/235 |
| 2002/0020119 A1 * | 2/2002 | Oberhofer | E04F 13/0835 52/27 |
| 2002/0031398 A1 * | 3/2002 | Ginzel | E06B 3/02 403/270 |
| 2004/0006939 A1 * | 1/2004 | Jobs | B32B 17/10009 52/235 |
| 2004/0068943 A1 * | 4/2004 | Morgan | E06B 3/5436 52/235 |
| 2005/0144862 A1 * | 7/2005 | Jackson, II | B32B 17/10036 52/204.5 |
| 2005/0188634 A1 * | 9/2005 | Bolton | B32B 17/10036 52/235 |
| 2005/0221062 A1 * | 10/2005 | Mann | B32B 17/10018 428/195.1 |
| 2006/0005482 A1 * | 1/2006 | Bennison | B32B 17/10036 52/204.5 |
| 2006/0099833 A1 * | 5/2006 | Mann | B32B 17/10036 439/63 |
| 2006/0101737 A1 * | 5/2006 | Platz | B32B 17/10036 52/204.5 |
| 2006/0272227 A1 * | 12/2006 | Doeppner | B32B 17/10036 52/171.3 |

(56) References Cited

U.S. PATENT DOCUMENTS

| | | | |
|---|---|---|---|
| 2006/0292380 A1* | 12/2006 | Mann | B32B 17/10045 428/426 |
| 2007/0071572 A1* | 3/2007 | Bohnet | E04F 13/0835 411/82 |
| 2007/0190282 A1* | 8/2007 | Erban | B32B 17/10036 428/49 |
| 2008/0053023 A1* | 3/2008 | Stenvall | E06B 3/5436 52/474 |
| 2009/0174300 A1* | 7/2009 | Jousse | B32B 17/10036 313/1 |
| 2010/0059253 A1* | 3/2010 | Labrot | B32B 17/10036 174/251 |
| 2010/0243047 A1* | 9/2010 | Kuster | H02S 40/34 136/256 |
| 2012/0024349 A1* | 2/2012 | Berens | H01L 31/02013 136/251 |
| 2012/0129401 A1* | 5/2012 | Corneille | H01L 31/02008 439/627 |
| 2013/0140847 A1* | 6/2013 | Altes | H01Q 1/1214 296/152 |
| 2013/0327372 A1* | 12/2013 | Pfennig | H01L 31/02008 136/251 |
| 2013/0330495 A1* | 12/2013 | Maatta | B23P 11/00 428/68 |
| 2014/0084119 A1* | 3/2014 | Frias | F16B 5/01 248/206.5 |
| 2014/0216526 A1* | 8/2014 | Doech | H01L 31/05 136/251 |
| 2014/0318058 A1* | 10/2014 | Morgan | E06B 3/5436 52/235 |
| 2015/0016132 A1* | 1/2015 | Verrat-Debailleul | B60Q 1/268 362/509 |
| 2015/0093539 A1* | 4/2015 | Krugmann | B32B 17/10036 428/99 |
| 2017/0009514 A1* | 1/2017 | Gruszecki | E06B 3/5436 |
| 2017/0051778 A1* | 2/2017 | Dickinson | B29C 45/006 |
| 2017/0218990 A1* | 8/2017 | Gonnet | B60J 1/006 |
| 2017/0256872 A1* | 9/2017 | Ebert | B60R 16/02 |
| 2018/0178482 A1* | 6/2018 | Uebelacker | B29C 45/14344 |

FOREIGN PATENT DOCUMENTS

| | | | | |
|---|---|---|---|---|
| DE | 732014 C | * | 2/1943 | B32B 17/10018 |
| DE | 1196330 B | * | 7/1965 | B32B 17/10385 |
| DE | 7801989 U1 | * | 7/1979 | B32B 17/10036 |
| DE | 4325024 A1 | * | 2/1995 | B32B 17/10036 |
| DE | 29716365 U1 | * | 1/1998 | B32B 17/10036 |
| DE | 19651649 A1 | * | 6/1998 | B60J 1/14 |
| DE | 19710824 C1 | * | 9/1998 | B32B 17/10036 |
| DE | 19751124 C1 | * | 4/1999 | B32B 9/04 |
| DE | 19859888 A1 | * | 7/2000 | B32B 17/10055 |
| DE | 19929480 A1 | * | 12/2000 | C09J 5/00 |
| DE | 10052529 A1 | * | 5/2002 | H01L 31/048 |
| DE | 10052538 A1 | * | 7/2002 | H01L 31/048 |
| DE | 10225140 A1 | * | 12/2003 | H01L 31/022425 |
| DE | 10333978 A1 | * | 2/2005 | B32B 17/10036 |
| DE | 202004017265 U1 | * | 2/2005 | B32B 17/10036 |
| DE | 202006007201 U1 | * | 10/2006 | B32B 17/10036 |
| DE | 102006027074 A1 | * | 9/2007 | B32B 17/10036 |
| DE | 102006019210 A1 | * | 10/2007 | H01L 31/05 |
| DE | 102008006553 A1 | * | 8/2009 | H05B 3/84 |
| DE | 202009010065 U1 | * | 12/2010 | E04H 13/003 |
| DE | 202011001267 U1 | * | 3/2011 | B32B 17/10036 |
| DE | 102009044770 A1 | * | 6/2011 | B32B 17/10036 |
| DE | 102011121031 A1 | * | 6/2013 | B32B 17/10293 |
| DE | 202014005330 U1 | * | 10/2014 | |
| EP | 0340089 A1 | * | 11/1989 | B32B 17/10036 |
| EP | 0367908 A1 | * | 5/1990 | B32B 17/10036 |
| EP | 0368728 A2 | * | 5/1990 | B32B 17/10036 |
| EP | 0506522 A1 | * | 9/1992 | B32B 17/10036 |
| EP | 1447494 A2 | * | 8/2004 | E04B 7/00 |
| EP | 1754844 A2 | * | 2/2007 | B32B 17/10036 |
| EP | 1865753 A1 | * | 12/2007 | H01R 4/34 |
| EP | 1908913 A1 | * | 4/2008 | E06B 3/5436 |
| EP | 2006465 A2 | * | 12/2008 | B32B 17/10036 |
| EP | 2339646 A1 | * | 6/2011 | H01L 31/02013 |
| EP | 2485275 A1 | * | 8/2012 | H01L 31/02008 |
| EP | 2583822 A1 | * | 4/2013 | B32B 17/10036 |
| EP | 2190665 B1 | * | 7/2013 | B32B 17/10036 |
| EP | 1297237 B1 | * | 9/2013 | B32B 17/10036 |
| EP | 2692979 A1 | * | 2/2014 | |
| EP | 2857192 A1 | * | 4/2015 | B32B 17/10018 |
| FR | 2732730 A1 | * | 10/1996 | B32B 17/10036 |
| FR | 2777316 A1 | * | 10/1999 | B32B 17/10036 |
| FR | 3002528 A1 | * | 8/2014 | B32B 17/10293 |
| JP | 02254012 A | * | 10/1990 | |
| JP | 08151239 A | * | 6/1996 | B32B 17/10036 |
| JP | 09170280 A | * | 6/1997 | B32B 17/10036 |
| JP | 2001252943 A | * | 9/2001 | |
| JP | 2005320214 A | * | 11/2005 | B32B 17/10293 |
| JP | 2005350290 A | * | 12/2005 | B32B 17/10036 |
| JP | 2006294646 A | * | 10/2006 | H02S 40/34 |
| KR | 100828460 B1 | * | 5/2008 | B32B 17/10036 |
| KR | 101174651 B1 | * | 8/2012 | B32B 17/10036 |
| KR | 101497455 B1 | * | 3/2015 | |
| KR | 20150052423 A | * | 5/2015 | B32B 17/10018 |
| KR | 20150129381 A | * | 11/2015 | |
| TW | 201203757 A | * | 1/2012 | B32B 17/10293 |
| WO | WO-9622443 A1 | * | 7/1996 | B32B 17/10036 |
| WO | 2004011755 A1 | | 2/2004 | |
| WO | WO-2006135365 A1 | * | 12/2006 | E06B 3/5436 |
| WO | WO-2009029897 A2 | * | 3/2009 | B32B 17/10036 |
| WO | WO-2010079142 A2 | * | 7/2010 | H02S 40/34 |
| WO | WO-2010121666 A2 | * | 10/2010 | B32B 17/10018 |
| WO | 2013053345 A1 | | 4/2013 | |
| WO | WO-2014086914 A1 | * | 6/2014 | B32B 17/10293 |

OTHER PUBLICATIONS

Machine Translation of DE 10225140 A1, Dec. 2003 (Year: 2003).*
Machine Translation of DE 102008006553 A1, Aug. 2009 (Year: 2009).*
Machine Translation of EP 2339646 A1, Jun. 2011 (Year: 2011).*
Machine Translation of DE 202011001267 U1, Mar. 2011 (Year: 2011).*
Machine Translation of KR 10-1174651 B1, Aug. 2012 (Year: 2012).*
Machine Translation of EP 2485275 A1, Aug. 2012 (Year: 2012).*
Machine Translation of EP 2190665 B1, Jul. 2013 (Year: 2013).*
Machine Translation of DE 1196330 B, Jul. 1965 (Year: 1965).*

* cited by examiner

GLASS FASTENING AND SEALING SYSTEMS

CROSS-REFERENCE TO RELATED APPLICATIONS

This application claims the benefit of U.S. Provisional Application No. 62/298,143, entitled "Glass Fastening and Sealing Systems," filed on Feb. 22, 2016, which is incorporated by reference in its entirety.

TECHNICAL FIELD

The application relates generally to joints for glass. More particularly, described embodiments relate to overmolds, seals, masks, and fasteners that are joined with laminated glass during or after the lamination process.

BACKGROUND

Laminated glass, or safety glass, is traditionally formed by bonding either a polyvinyl butyral (PVB) or ethylenevinyl acetate (EVA) interlayer between two layers of glass. A thin film or layer of PVB or EVA can be placed between two layers of glass, a vacuum can be applied to remove air from between the various layers, and then heat and/or pressure can be applied to bond the layers together, for example, using an autoclave. Laminated glass can be used to dampen sound transmission and increase the level of safety in architectural and automotive applications, for example, to deter shattering of windows during a hurricane or dampen sound entering through the windows of a passenger compartment of a vehicle.

Traditional fastening systems for laminated glass include edge-style frames and c-shaped or u-shaped clamps that surround panes of laminated glass as well as spider-style fittings attached to bore-based fasteners configured to position the corners of multiple pieces of laminated glass adjacent to each other. More elegant fastening solutions are needed to minimize visibility of the fastening system.

SUMMARY

The disclosure relates to glass fastening and sealing systems. In one aspect of the disclosure, a glass fastening system includes a first glass pane, a second glass pane defining a bore, an interlayer disposed between and extending along interior surfaces of the first glass pane and the second glass pane, and a fastener having a first portion disposed along the interlayer between the first glass pane and the second glass pane and a second portion extending outward from an exterior surface of the second glass pane.

In another aspect of the disclosure, a glass fastening system includes a first glass pane, a second glass pane, an interlayer disposed between the glass panes, an adhesive layer disposed along an exterior surface of the second glass pane, and a fastener having a first portion extending along the adhesive layer and a second portion extending from the first portion and away from the exterior surface. The second portion of the fastener is configured to secure the first glass pane and the second glass pane to a support structure.

In another aspect of the disclosure, a glass sealing system includes a first glass portion having a first edge portion, a second glass portion having a second edge portion, an interlayer disposed between the first glass portion and the second glass portion, and a seal comprising an overmold portion capturing the first edge portion and the second edge portion.

In another aspect of the disclosure, a glass sealing system includes a first glass pane, a second glass pane defining a recessed portion and a plurality of bores within the recessed portion, an interlayer disposed between the first glass pane and the second glass pane, and a seal. The seal includes an internal portion extending along and disposed within the recessed portion, an external portion axially aligned with the internal portion and extending along an exterior surface of the second glass pane, and connection portions extending through the bores from the internal portion to the external portion.

BRIEF DESCRIPTION OF THE DRAWINGS

The disclosure will be readily understood by the following detailed description in conjunction with the accompanying drawings, wherein like reference numerals designate like structural elements. A description of the drawings is as follows.

DETAILED DESCRIPTION

The following disclosure relates to glass fastening systems, sealing systems, and support structures. In some examples of fastening systems, fastener portions are embedded between glass panes during a glass lamination process. In other examples of fastening systems, fastener portions are adhered to exterior surfaces of glass panes or magnetically attracted to each other through glass panes. In examples of sealing systems, seals are partially embedded within or encapsulated around edges of laminated glass portions, either during or after the lamination process. In examples of support structures, transparent, ductile support bodies extend between overmold portions to capture and support laminated glass portions.

The glass fastening and sealing systems described below can be implemented in automotive applications, for example, to increase the transparent area of glass surfaces in a vehicle such as the windshield, door windows, backlight, or roof. Embedded fasteners can be used to attach laminated glass directly to underlying body structure, such as an A-, B-, or C-pillar in a vehicle. Embedded or encapsulated seals can be used to abut portions of laminated glass, for example, at a door window to a windshield or a backlight interface, allowing more of the interface to be transparent. Supporting laminated glass portions within a transparent, ductile body can also increase the transparent area of various glass vehicle surfaces.

Figure 1:
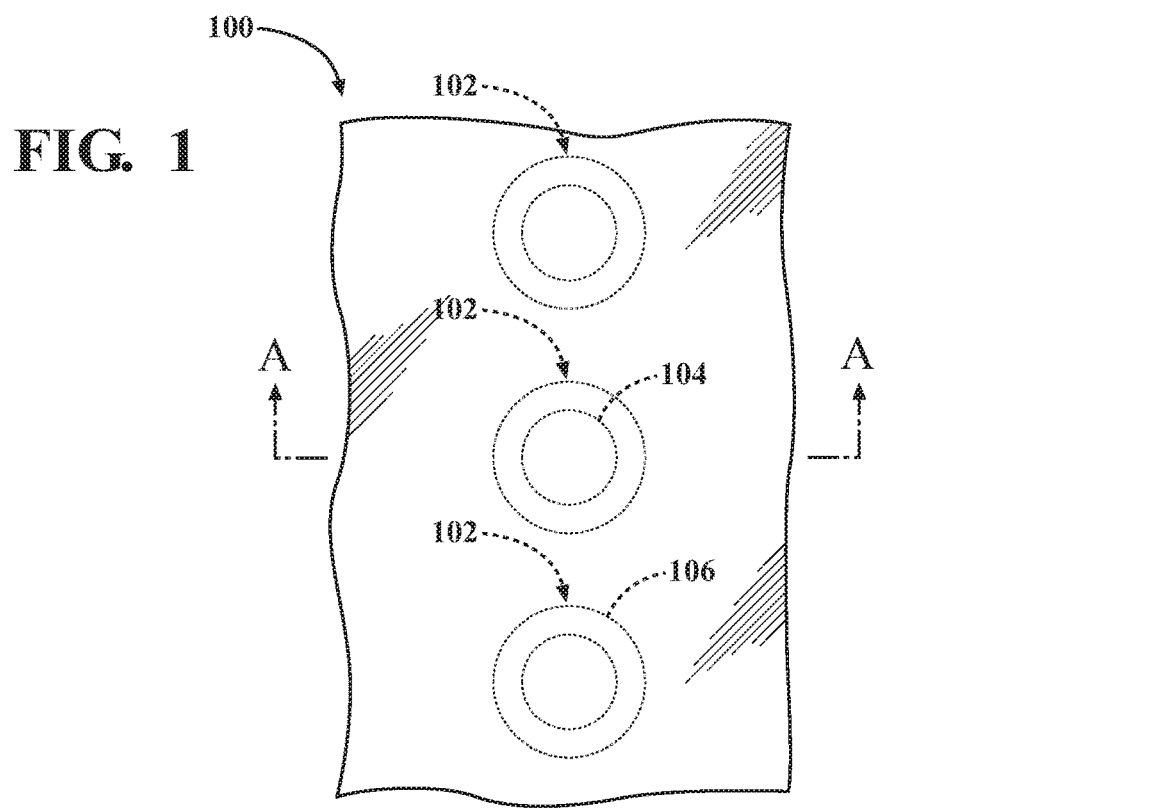
FIG. 1 shows a top view of laminated glass including a fastening system.

FIG. 1 shows a top view of laminated glass 100 including an example of a fastening system. As seen in the top view, multiple fasteners 102 are included in the fastening system, each including a fastener portion 104 embedded within or adhered to the laminated glass 100 and a fastener portion 106 configured to couple with the embedded or adhered fastener portion 104, for example, in association with a structure to which the laminated glass 100 is connected, such as a vehicle pillar or a door frame. A section, A-A, is shown as extending through a central fastener 102 in the fastening system. Sectional views through section A-A for various examples of the fastener 102 are described in conjunction with FIGS. 2-4 below.

Figure 2:
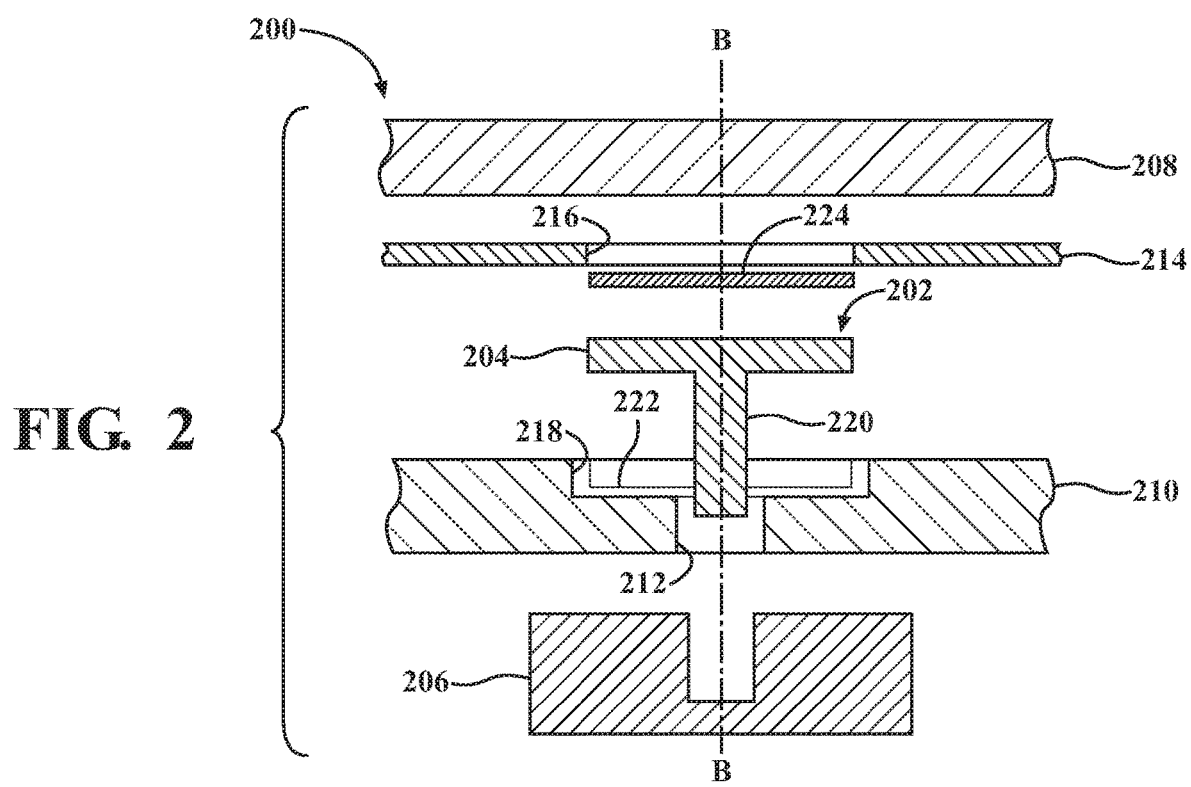
FIG. 2 shows an exploded sectional view of a fastener embedded in a portion of the laminated glass of FIG. 1 during glass lamination.

FIG. 2 shows an exploded sectional view of a fastener 202 embedded in a laminated glass portion 200 during the lamination process. The laminated glass portion 200 can be part of the laminated glass 100 of FIG. 1. The sectional view of laminated glass portion 200 includes a first glass pane 208 and a second glass pane 210. The second glass pane 210 defines a bore 212. The laminated glass portion 200 also includes an interlayer 214 defining another bore 216, the bore 216 in the interlayer 214 being axially aligned with the bore 212 in the second glass pane 210, for example, along axis B. The interlayer 214 is disposed between the first glass pane 208 and the second glass pane 210 and extends along interior surfaces of the first glass plane 208 and the second glass pane 210 so as to couple the first and second glass panes 208, 210. The interlayer 214 can include a pressure-based adhesive and/or a thermally-activated adhesive configured to join the first glass pane 208 and the second glass pane 210 during the lamination process.

The fastener 202 in the laminated glass fastening system of FIG. 2 includes a fastener portion 204 disposed at least partially within the bore 216 in the interlayer 214 once the lamination process is complete. The second glass pane 210 can also include a relief portion 218 formed, for example, by grinding or machining. The relief portion 218 is configured both to avoid an increase in thickness in the laminated glass portion 200 and to assist in locating the fastener portion 204 before the lamination process. Thus, the fastener portion 204 becomes captured, or sandwiched, between the first glass pane 208 and the second glass pane 210 once lamination is complete. The fastener 202 also includes a fastener portion 220 extending from the fastener portion 204 and through the bore 212 in the second glass pane 210. The fastener portion 220 can extend below a bottom surface of the second glass pane 210 after the lamination process is complete.

The fastener 202 also includes a fastener portion 206 configured to capture the fastener portion 220 that extends through the bore 212 beyond the bottom surface of the second glass pane 210. In this example, the fastener portion 206 is a female portion and the fastener portion 220 is a male portion, though other configurations are also possible. The fastener portion 206 can be disposed in, extend through, or generally be associated with a structure such that connection of the fastener portion 220 with the fastener portion 206 couples the laminated glass portion 200 to the underlying structure.

The lamination process can include placing a compliant layer 222 between the fastener portion 204 and the relief portion 218 of the second glass pane 210. The compliant layer 222 can be deformable and configured to dissipate clamp loads between the fastener 202 and the second glass pane 210 since machining or grinding the relief portion 218 can create additional stress on the laminated glass portion 200. Though the compliant layer 222 is shown as located within the relief portion 218, the fastener 202 could alternatively be designed to include the compliant layer 222.

The lamination process for embedding the fastener 202 of FIG. 2 can also include placing a conductive layer 224 between the first glass pane 208 and the fastener portion 204, the conductive layer 224 being configured to transmit energy through the fastener 202. In one example, the conductive layer 224 can be designed to collect solar energy. In another example, the conductive layer 224 can be designed to transmit electricity in order to power devices associated with the laminated glass portion 200, such as lights, sensors, etc. In some cases, these devices can be part of the embedded fastener 202.

Figure 3:
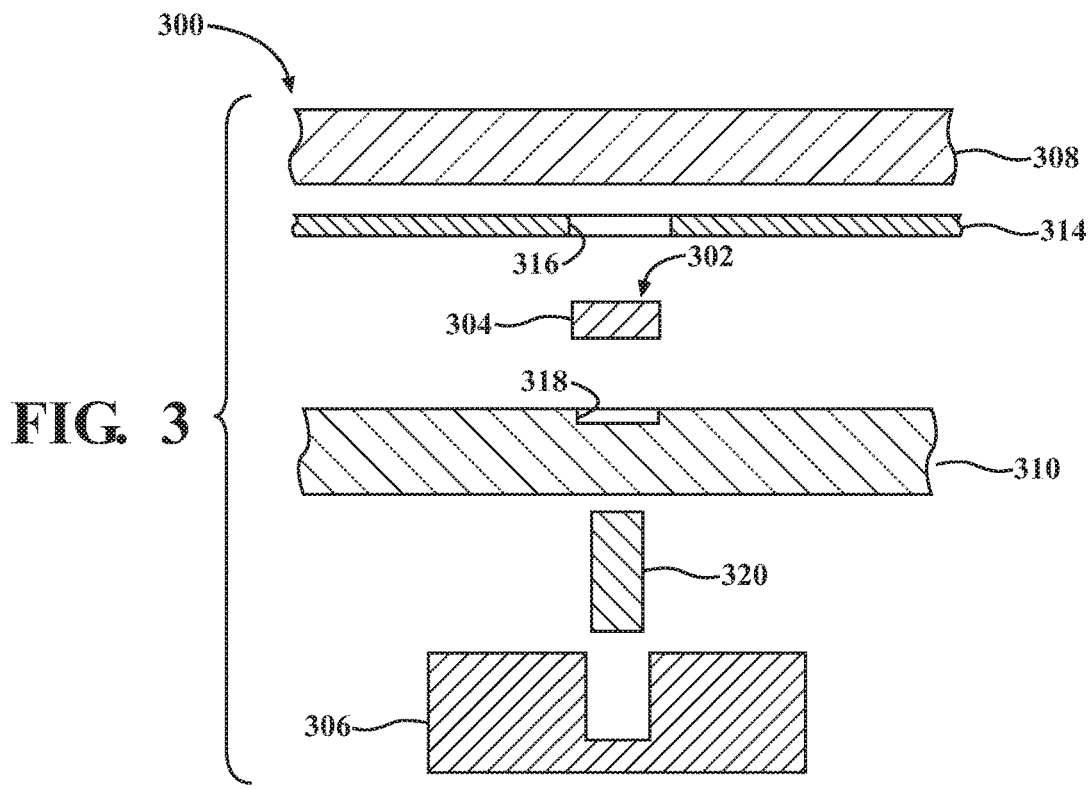
FIG. 3 shows an exploded sectional view of another fastener embedded in a portion of the laminated glass of FIG. 1 during glass lamination.

FIG. 3 shows an exploded sectional view of another fastener 302 embedded in a laminated glass portion 300 during the lamination process. The laminated glass portion 300 can be part of the laminated glass 100 of FIG. 1. The sectional view of the laminated glass portion 300 includes a first glass pane 308 and a second glass pane 310. The laminated glass portion 300 also includes an interlayer 314 defining a bore 316. The interlayer 314 is disposed between the first glass pane 308 and the second glass pane 310 and extends along interior surfaces of the first glass plane 308 and the second glass pane 310 so as to couple the first and second glass panes 308, 310. The interlayer 314 can include a pressure-based adhesive and/or a thermally-activated adhesive configured to join the first glass pane 308 and the second glass pane 310 during the lamination process.

The fastener 302 in the laminated glass fastening system of FIG. 3 includes a fastener portion 304 disposed at least partially within the bore 316 in the interlayer 314 once the lamination process is complete. To aid in locating the fastener portion 304 during the lamination process and avoid an increase in overall thickness, the second glass pane 310 can include a relief portion 318 formed, for example, by grinding or machining. The fastener portion 304 becomes captured, or sandwiched, between the first glass pane 308 and the second glass pane 310 once lamination is complete, nestled within the bore 316 and the relief portion 318.

The fastener 302 also includes a fastener portion 320 disposed on an exterior surface of the second glass pane 310. The fastener portion 320 can be aligned with the fastener portion 304 after the lamination process is complete by having one of the fastener portion 304 and the fastener portion 320 formed of a magnetic material and the other of the fastener portion 304 and the fastener portion 320 formed of a magnetically attractable material, that is, the two fastener portions 304, 320 are attracted magnetically.

The magnet, be it part of the fastener portion 304 or the fastener portion 320, can be designed to have sufficient strength to allow the fastener portion 320 to be further coupled to the separate fastener portion 306. The fastener portion 306 is configured to capture the fastener portion 320. In this example, the fastener portion 306 is a female portion and the fastener portion 320 is a male portion, though other configurations are also possible. In a similar manner as described in respect to FIG. 2, the fastener portion 306 can be disposed in, extend through, or generally be associated with a structure such that connection of the fastener portion 320 with the fastener portion 306 couples the laminated glass portion 300 to the underlying structure.

Figure 4:
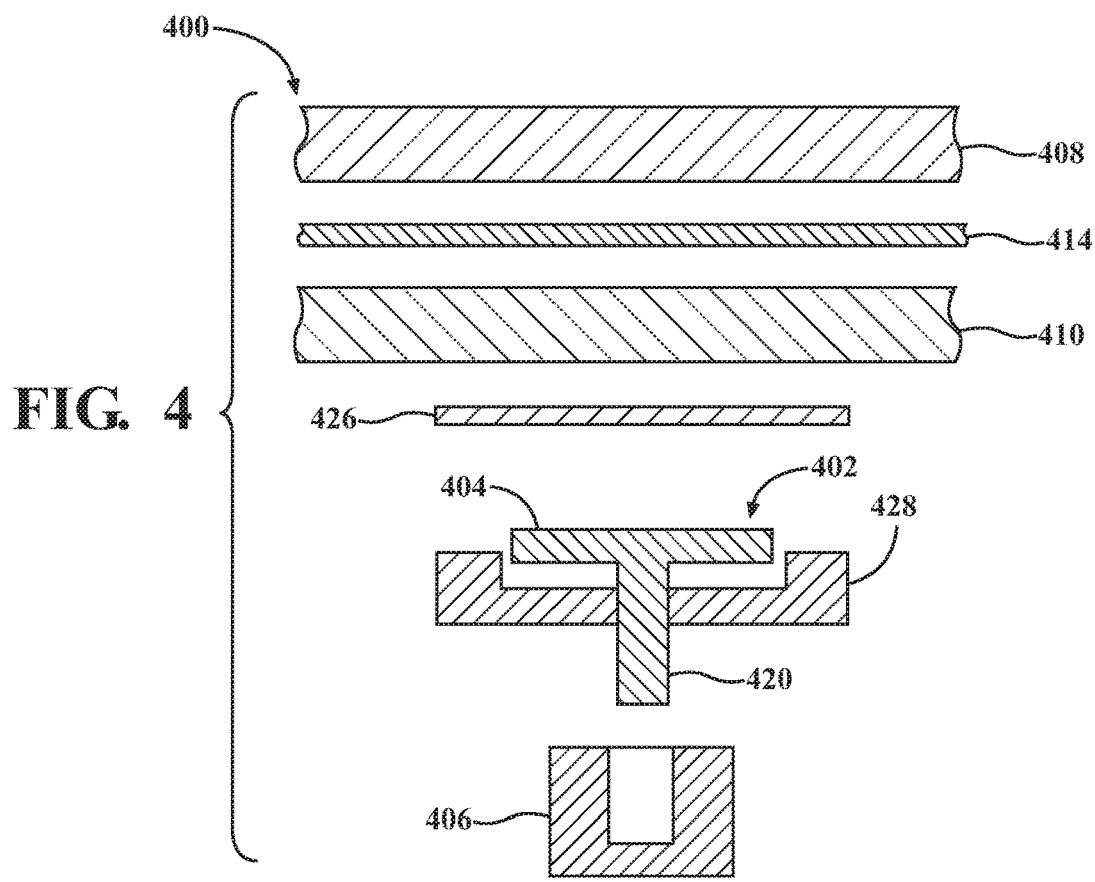
FIG. 4 shows an exploded sectional view of another fastener adhered to a portion of the laminated glass of FIG. 1.

FIG. 4 shows an exploded sectional view of another fastener 402 adhered to a laminated glass portion 400. The laminated glass portion 400 can be part of the laminated glass 100 of FIG. 1. The laminated glass portion 400 includes a first glass pane 408, a second glass pane 410, and an interlayer 414 disposed between the first glass pane 408 and the second glass pane 410. As in previous examples, the interlayer 414 joins the first glass pane 408 and the second glass pane 410 during the lamination process. A fastener 402 is attached to the second glass pane 410 using an adhesive 426, the adhesive being disposed on an exterior surface of the second glass pane 410. Alternatively, the adhesive 426 can be applied to the fastener 402 before attachment to the laminated glass portion 400.

Specifically, the fastener 402 includes a fastener portion 404 that is disposed on and extends for the length of the adhesive 426 and a fastener portion 420 extending away from the fastener portion 404 and away from an exterior surface of the second glass pane 410. Optionally, the fastener portion 404 can include, comprise, or be contained within a glass housing 428, or at least formed of a glass material. In this example, the adhesive 426 connects two glass surfaces together. Using a glass housing 428 or a glass material in association with the fastener portion 404 provides additional structure and strength to the fastener 402 while at the same time minimizing stress to the laminated glass portion 400 and maintaining transparency.

The fastener 402 can also include a fastener portion 406 configured to capture the fastener portion 420. In this example, the fastener portion 406 is a female portion and the fastener portion 420 is a male portion, though other configurations are also possible. In a similar manner as described in respect to FIGS. 2 and 3, the fastener portion 406 can be disposed in, extend through, or generally be associated with a structure such that connection of the fastener portion 420 with the fastener portion 406 couples the laminated glass portion 400 to the underlying structure.

Figure 5:
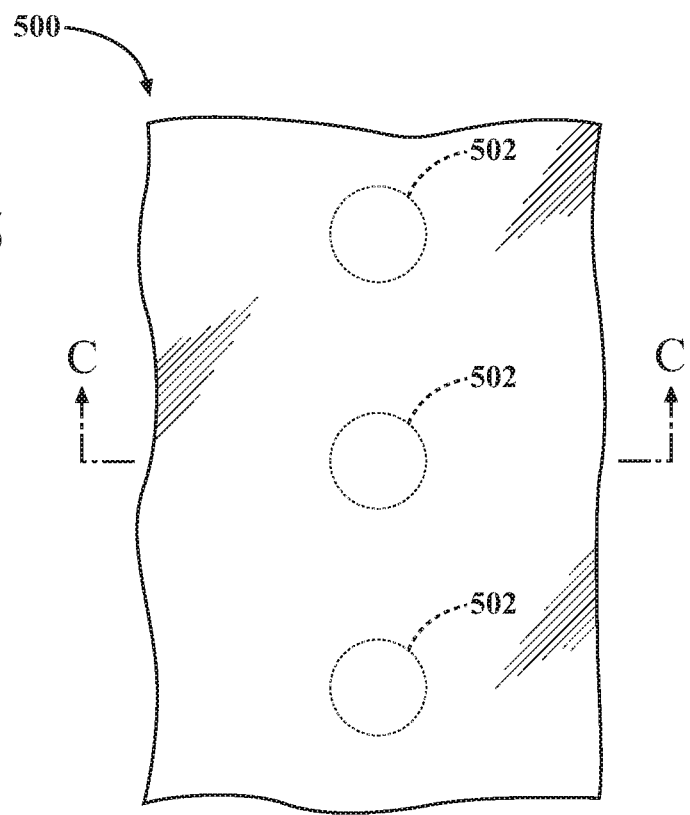
FIG. 5 shows a top view of laminated glass including another type of fastening system.

FIG. 5 shows a top view of laminated glass 500 including another type of fastening system. As seen in this top view, multiple fasteners 502 are included in the fastening system, portions of the fasteners 502 being present on a top surface of the laminated glass 500. A section, C-C, is shown as extending through a central fastener 502 in the fastening system. A sectional view along section C-C through a fastener similar to one of the fasteners 502 is described in conjunction with FIG. 6 below.

Figure 6:
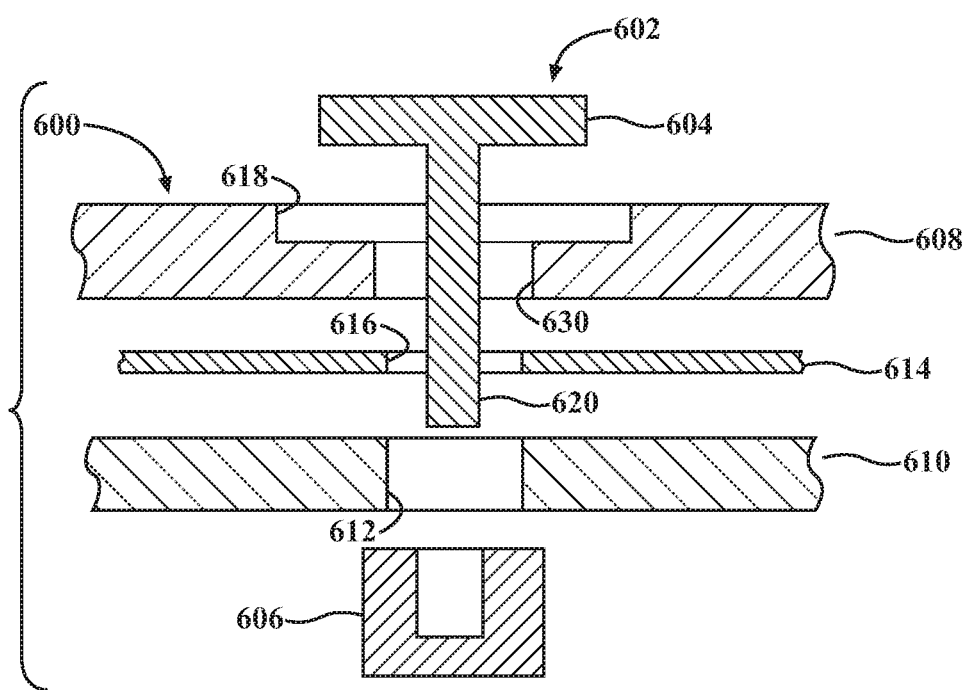
FIG. 6 shows an exploded sectional view of a fastener extending through a portion of the laminated glass of FIG. 5.

FIG. 6 shows an exploded sectional view of a fastener 602 extending through a laminated glass portion 600. The laminated glass portion 600 can be part of the laminated glass 500 of FIG. 5. The laminated glass portion 600 includes a first glass pane 608 having a relief portion 618 and defining a bore 630, a second glass pane 610 defining a bore 612, and an interlayer 614 defining a bore 616. The bores 612, 616, 630 are axially aligned and the interlayer 614 is disposed between the first glass pane 608 and the second glass pane 610.

The fastener 602 includes a fastener portion 604 at least partially disposed within the relief portion 618 within the first glass pane 608 and a fastener portion 620 extending from the fastener portion 604 through all three bores 612, 616, 630. The fastener 602 also includes a fastener portion 606 configured to capture the fastener portion 620. In FIG. 6, the fastener portion 620 is shown as a male portion and the fastener portion 606 is shown as a female portion, though other configurations are possible. For example, the fastener portion 606 can at least partially extend through the bore 612 to capture the fastener portion 620. The fastener portion 606 can extend from or be captured within a support structure, such as a vehicle pillar or a door frame.

In operation, the laminated glass portion 600 can be machined, drilled, bored, etc. either before or after the lamination process, and the fastener portion 606 can be associated with or make contact with an underlying structure in order to join the laminated glass portion 600 to the structure. In the example of FIG. 6, the fastener portion 604 is designed so as to be flush with an outer surface of the first glass pane 608 after connection of the laminated glass portion 600 to the structure.

Figure 7:
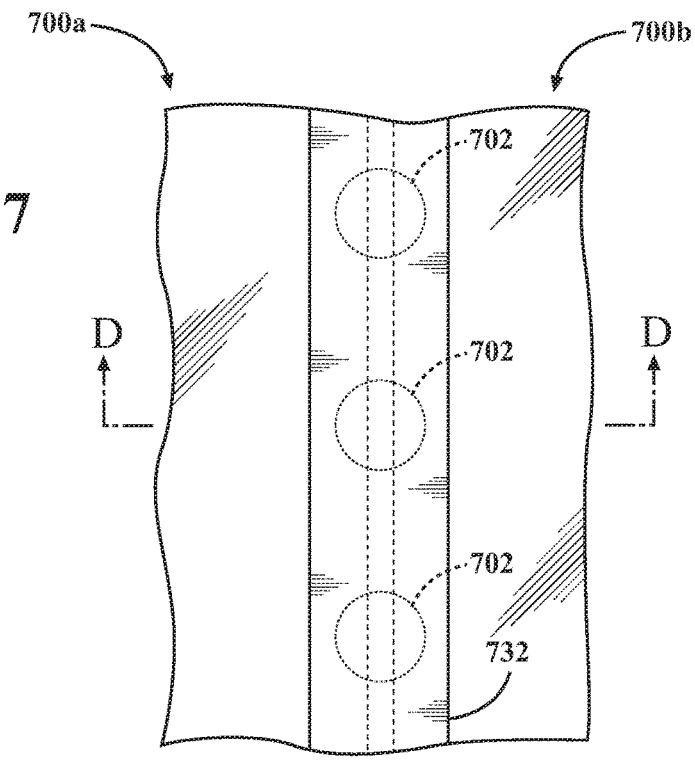
FIG. 7 shows a top view of a juncture for two portions of laminated glass including another type of fastening system.

FIG. 7 shows a top view of a juncture for two laminated glass portions 700a,b including another type of fastening system. As seen in the top view, multiple fasteners 702 are included in the fastening system, portions of the fasteners 702 being present on a top surface of a trim element 732 used to clamp the two laminated glass portions 700a,b together. A section, D-D, is shown as extending through a central fastener 702 in the fastening system. A sectional view through section D-D of a fastener similar to one of the fasteners 702 is described in conjunction with FIG. 8 below.

Figure 8:
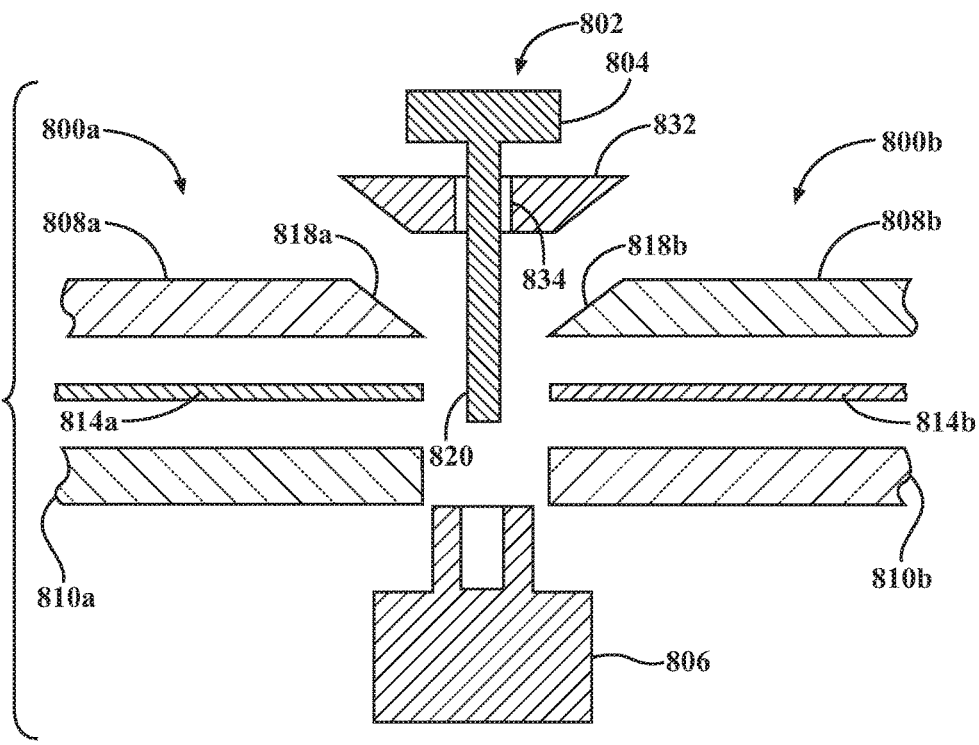
FIG. 8 shows an exploded sectional view of a fastener for clamping the two portions of laminated glass of FIG. 7.

FIG. 8 shows an exploded sectional view of a fastener 802 for clamping two laminated glass portions 800a,b together. The laminated glass portions 800a,b can be part of or similar to the laminated glass portions 700a,b of FIG. 7. The laminated glass portions 800a,b each include first glass panes 808a,b, second glass panes 810a,b, and interlayers 814a,b. Both laminated glass portions 800a,b also include recess portions 818a,b on upper surfaces. A trim element 832 is disposed within the recess portions 818a,b. In a manner similar to that shown for the trim element 732 of FIG. 7, the trim element 832 of FIG. 8 can extend for most of the length of the two laminated glass portions 800a,b in order to define a clamping surface against the two laminated glass portions 800a,b.

The trim element 832 also defines a bore 834, the bore 834 being configured to receive the fastener 802. The fastener 802 in FIG. 8 includes a fastener portion 804 that is disposed along an upper surface of the trim element 832 and a fastener portion 820 that extends from the fastener portion 804 through the bore 834 and along side surfaces of the two laminated glass portions 800a,b. The fastener 802 also includes a fastener portion 806 configured to capture the fastener portion 820 and clamp the two laminated glass portions 800a,b together in conjunction with the trim element 832. The trim element 832 can also include a recess portion (not shown) such that the fastener portion 804 sits within the recess portion of the trim element 832 once the clamp load is applied.

In FIG. 8, the fastener portion 820 is shown as a male portion and the fastener portion 806 is shown as a female portion, though other fastening schemes are also possible. In this example, the fastener portion 806 is also designed to extend along the side surfaces of the two laminated glass portions 800a,b when it captures the fastener portion 820. Again, the fastener portion 806 can be associated with, captured within, or extend from an underlying structure such as a vehicle pillar or a door frame such that the fastening system clamps the two laminated glass portions 800a,b to the underlying structure using the trim element 832.

Figure 9:
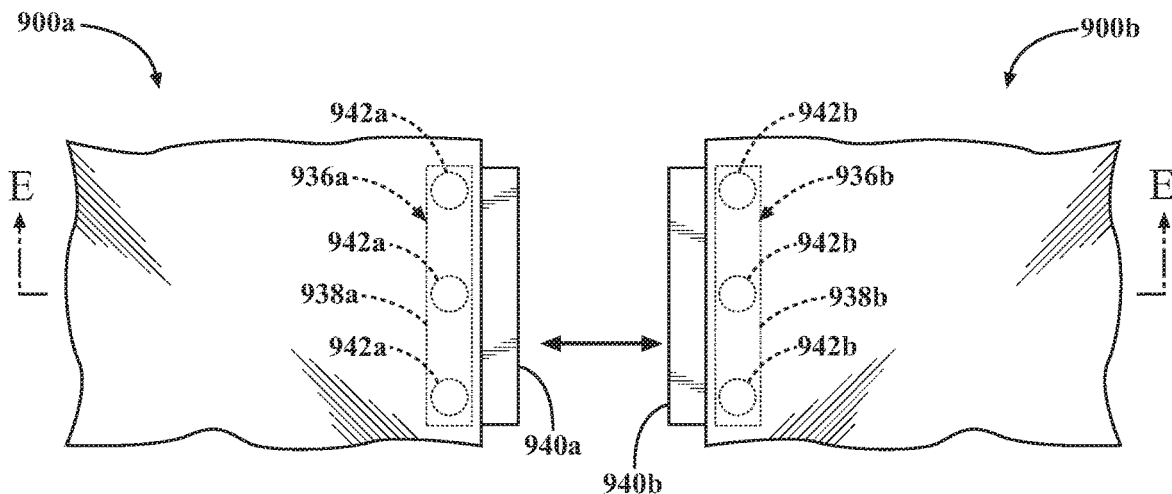
FIG. 9 shows a top view of a sealing juncture for two portions of laminated glass with at least one portion movable in respect to the other portion.

FIG. 9 shows a top view of a sealing juncture for two laminated glass portions 900a,b with at least one portion 900a movable in respect to the other portion 900b. Each of the laminated glass portions 900a,b includes an embedded seal 936a,b. The seals 936a,b include internal portions 938a,b, external portions 940a,b, and a plurality of connection portions 942a,b that extend from the internal portions 938a,b to the external portions 940a,b of the seals 936a,b. The sealing juncture is designed such that the external portion 940a can couple with the external portion 940b when the two laminated glass portions 900a,b are brought together, for example, in the case of moving window in the door of a vehicle. A section, E-E, is shown as extending through a pair of central connection portions 942a,b in the sealing system. A sectional view through section E-E for a connection portion similar to the central connection portions 942a,b is described in conjunction with FIG. 10 below.

Figure 10:
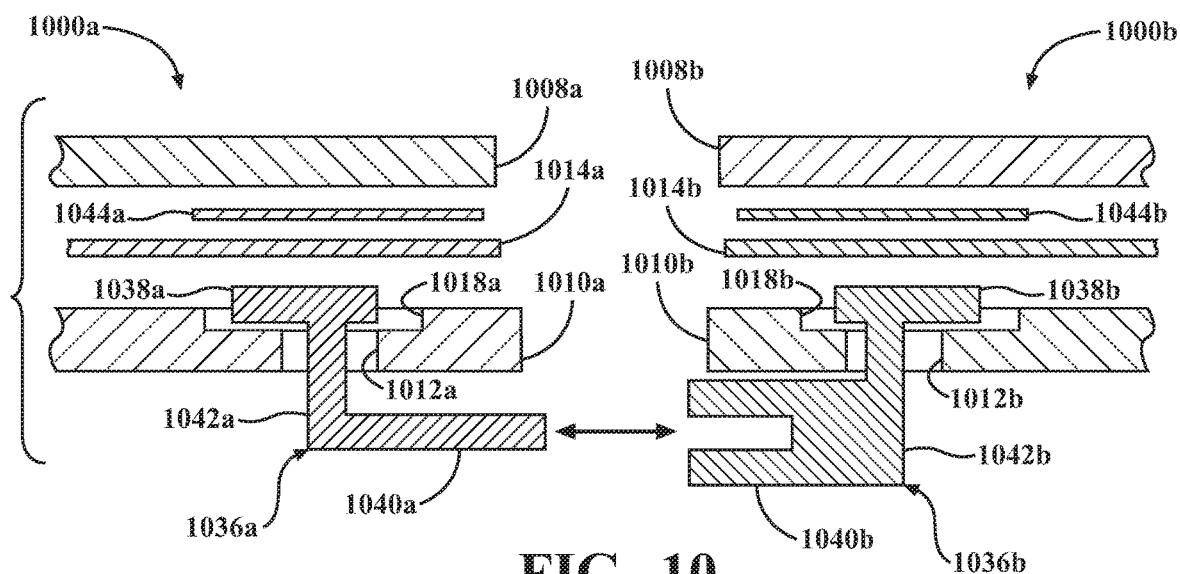
FIG. 10 shows an exploded sectional view of the sealing juncture of FIG. 9 with seals embedded during glass lamination.

FIG. 10 shows an exploded sectional view of the sealing juncture of FIG. 9. Each of the laminated glass portions 1000a,b in FIG. 10 includes a first glass pane 1008a,b, a second glass pane 1010a,b, and an interlayer 1014a,b disposed between the first and second glass panes 1008a,b, 1010a,b. The second glass panes 1010a,b define recessed portions 1018a,b and bores 1012a,b. The recessed portions 1018a,b can extend along the length of the second glass panes 1010a,b and the bores 1012a,b can be multiple and spaced along the recessed portions 1018a,b at predetermined intervals.

The laminated glass sealing system of FIG. 10 can include a pair of seals 1036a,b. The seals 1036a,b can include internal portions 1038a,b that extend along and are disposed within the recessed portions 1018a,b. The seals 1036a,b can also include external portions 1040a,b that are axially aligned with the internal portions 1030a,b and extend along an exterior surface of the second glass panes 1010a,b. In this example, the external portions 1040a,b also extend beyond the sides of the second glass panes 1010a,b, forming lips or edges for the seals 1036a,b outside of the second glass panes 1010a,b.

The seals 1036a,b can also include multiple connection portions 1042a,b, the connection portions 1042a,b extending through the bores 1012a,b from the internal portions 1038a,b to the external portions 1040a,b. The seals 1036a,b can be located prior to lamination, for example, by passing the external portions 1040a,b through the bores 1012a,b. Alternatively, the seals 1036a,b can be applied to the laminated glass portions 1000a,b after the lamination process, for example, using injection molding or another process configured to force the material of the seals into the recessed portions 1018a,b through the bores 1012a,b.

In operation of the sealing system of FIG. 10, the two external portions 1040a,b can be engaged by sliding the laminated glass portions 1000a,b toward each other in the same plane. In this example, the external portion 1040a is a male portion and the external portion 1040b is a female portion, though other coupling schemes are also possible. The laminated glass sealing system of FIG. 10 also includes a set of masks 1044a,b disposed between the first glass panes 1008a,b and the interlayers 1014a,b, the masks 1044a,b being axially aligned with the internal portions 1038a,b of the seals 1036a,b so as to block visibility of the seals 1036a,b from an external surface of the first glass panes 1008a,b. The masking feature is optional and serves to change the appearance of the laminated glass sealing system.

Figure 11:
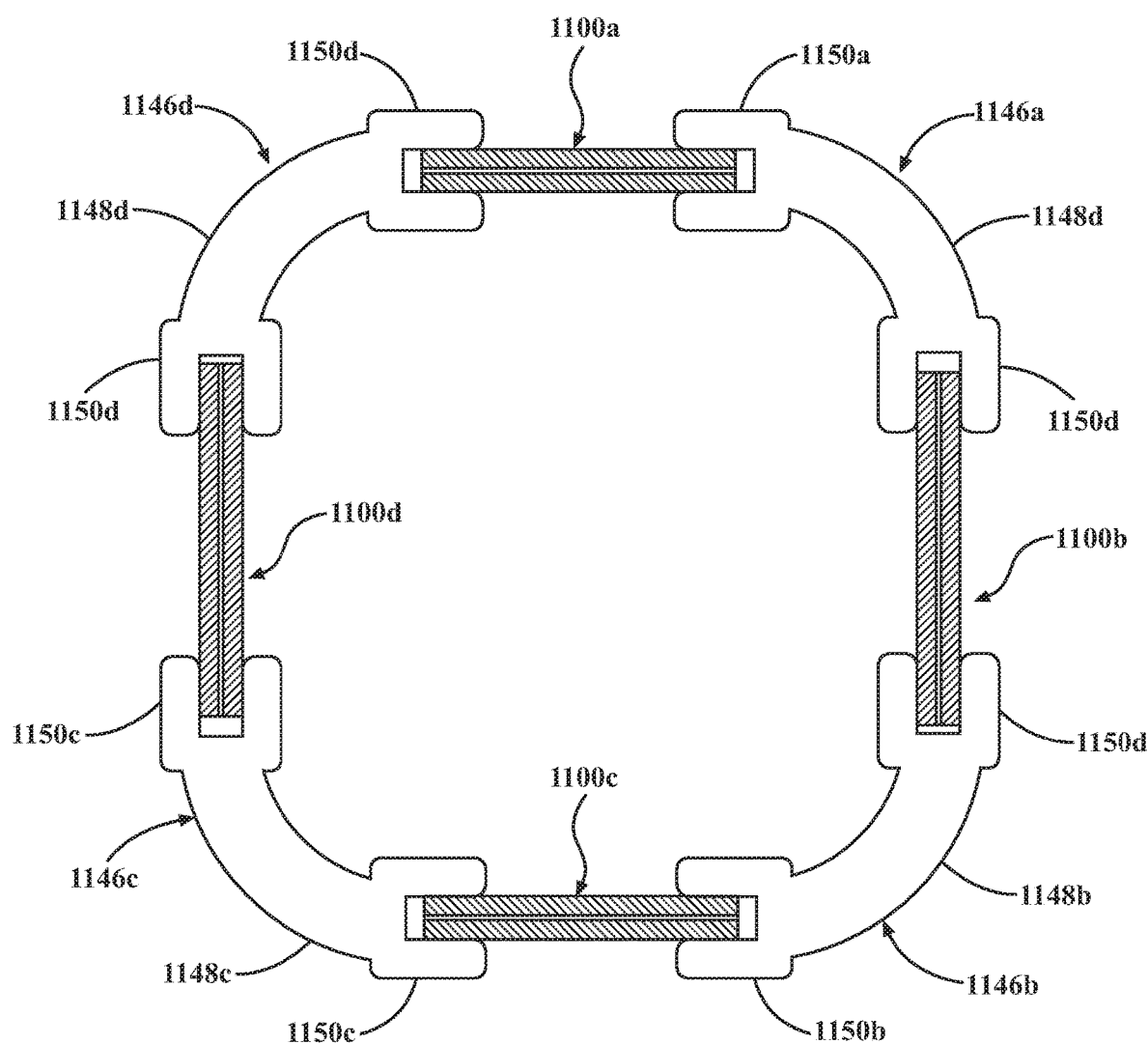
FIG. 11 shows a sectional view of laminated glass sections disposed within a ductile, structural overmold.

FIG. 11 shows a sectional view of laminated glass portions 1100a,b,c,d disposed within ductile, structural overmolds. In this example, the overmolds are support structures 1146a,b,c,d including support bodies 1148a,b,c,d extending between pairs of overmold sections 1150a,b,c,d, with each of the overmold sections 1150a,b,c,d capturing one end of the laminated glass portions 1100a,b,c,d. Though the example of FIG. 11 includes four laminated glass portions 1100a,b,c,d and four support structures 1146a,b,c,d coupled in a ring shape, other configurations are also possible.

The support structures 1146a,b,c,d can be formed of a non-glass material, such as a composites or a polymer with transparent properties, making both the laminated glass portions 1100a,b,c,d and the support structures 1146a,b,c,d transparent. The support structures 1146a,b,c,d can also be formed of a ductile material that allows deformation while at the same time providing sufficient stiffness to withstand outside forces acting upon the laminated glass portions 1100a,b,c,d without bending or buckling. These outside forces can be caused, for example, by winds from weather events, by impact from other structures, etc.

Figure 12:
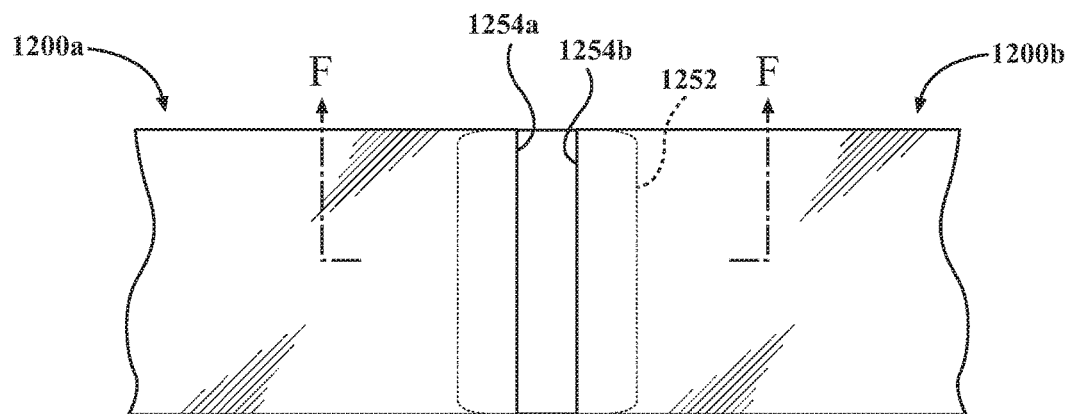
FIG. 12 shows a top view of another sealing juncture for two portions of laminated glass adhered to a support structure.

FIG. 12 shows a top view of another sealing juncture for two laminated glass portions 1200a,b adhered to a support structure 1252. The support structure 1252 can be, for example, a vehicle pillar, such as an a-pillar or a roof beam extending between a-pillars on a vehicle, or an architectural beam, such as a brace extending between a floor and a ceiling in a building. The sealing juncture can be designed such that an outer edge 1254a of the laminated glass portion 1200a is spaced from an outer edge 1254b of the laminated glass portion 1200b when the two laminated glass portions 1200a,b are adhered to the support structure 1252. The sealing juncture can also be designed such that both laminated glass portions 1200a,b overlap an upper surface of the support structure 1252 to allow for build tolerance variation when securing the laminated glass portions 1200a,b to the support structure 1252. A section, F-F, is shown as extending through the laminated glass portions 1200a,b and the support structure 1252 in the sealing system. Various sectional views through section F-F for a variety of sealing and attachments systems are described in conjunction with FIGS. 13-17 below.

Figure 13:
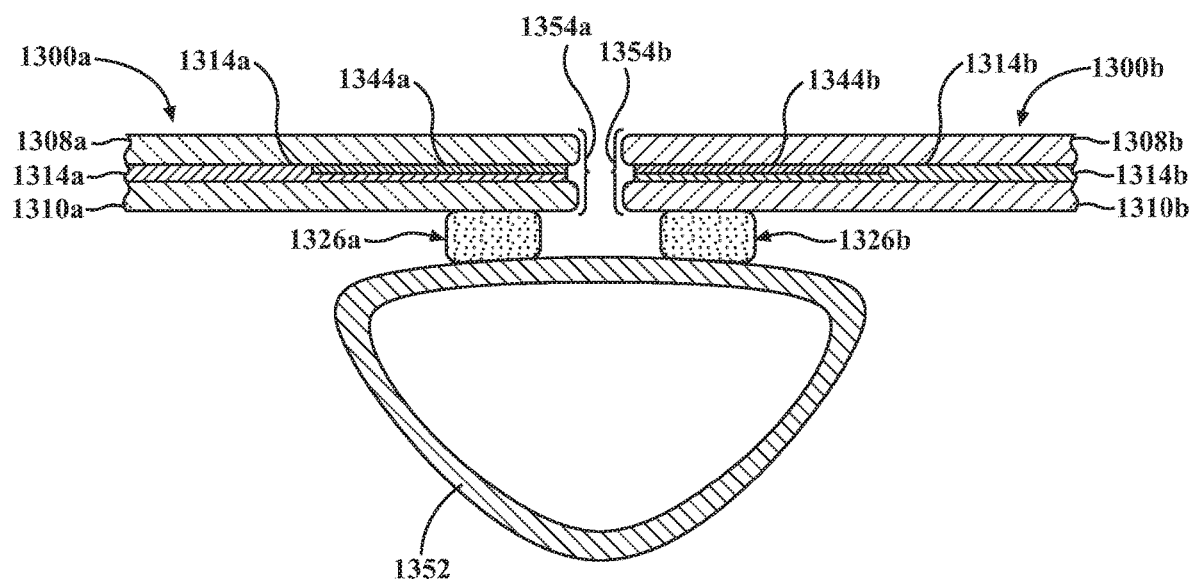
FIG. 13 shows a sectional view of the sealing juncture of FIG. 12 with masks embedded during glass lamination.

FIG. 13 shows a sectional view of the sealing juncture of FIG. 12 with masks 1344a,b embedded during glass lamination. The sealing juncture can include two glass portions 1300a,b having first glass panes 1308a,b, second glass panes 1310a,b, and interlayers 1314a,b. Though shown as laminated glass portions 1300a,b, other forms of glass or other transparent materials are also possible. Adhesive layers 1326a,b, for example, in the form of a thick, curable, compliant adhesive such as urethane, can be disposed on exterior surfaces of the glass portions 1300a,b in order to secure the glass portions 1300a,b to a support structure 1352. In the example of FIG. 13, the adhesive layers 1326a,b are positioned near outer edges 1354a,b of the glass portions 1300a,b such that the adhesive layers 1326a,b can be compressed against the support structure 1352 and, for example, cured or dried, in order to firmly secure the glass portions 1300a,b to the support structure 1352.

When being secured to the support structure 1352, the outer edges 1354a,b of the glass portions 1300a,b are generally aligned while at the same time slightly spaced in order to avoid contact between the outer edges 1354a,b. Additionally, a sufficient amount of overlap is designed between the glass portions 1300a,b and the support structure 1352 such that build variation in the support structure 1352 or placement of the adhesive layers 1326a,b does not impact sealing of the adhesive layers 1326a,b to the support structure 1352. Once the glass portions 1300a,b are secured to the support structure 1352, the visual effect becomes one of floating glass, with both the support structure 1352 and the adhesive layers 1326a,b visible through the glass portions 1300a,b.

In the case where viewing the adhesive layers 1326a,b is not desirable or the adhesive requires isolation from solar radiation, the glass portions 1300a,b can be designed with integrated masks 1344a,b, for example, of a color or style matching, coordinating with, or otherwise complementing the support structure 1352 or other design features of the overall structure in which the glass portions 1300a,b are installed. The masks 1344a,b can be laminated between the respective glass panes 1308a,b, 1310a,b or can be applied to an exterior surface of the glass portions 1300a,b. When applied, the masks 1344a,b are designed for axial alignment with the adhesive layers 1326a,b such that the adhesive layers 1326a,b are not visible through the glass portions 1300a,b. The masks 1344a,b can include any number of colors, materials, or design features so as to both cover the adhesive layers 1326a,b and provide a pleasing visual effect.

Figure 14:
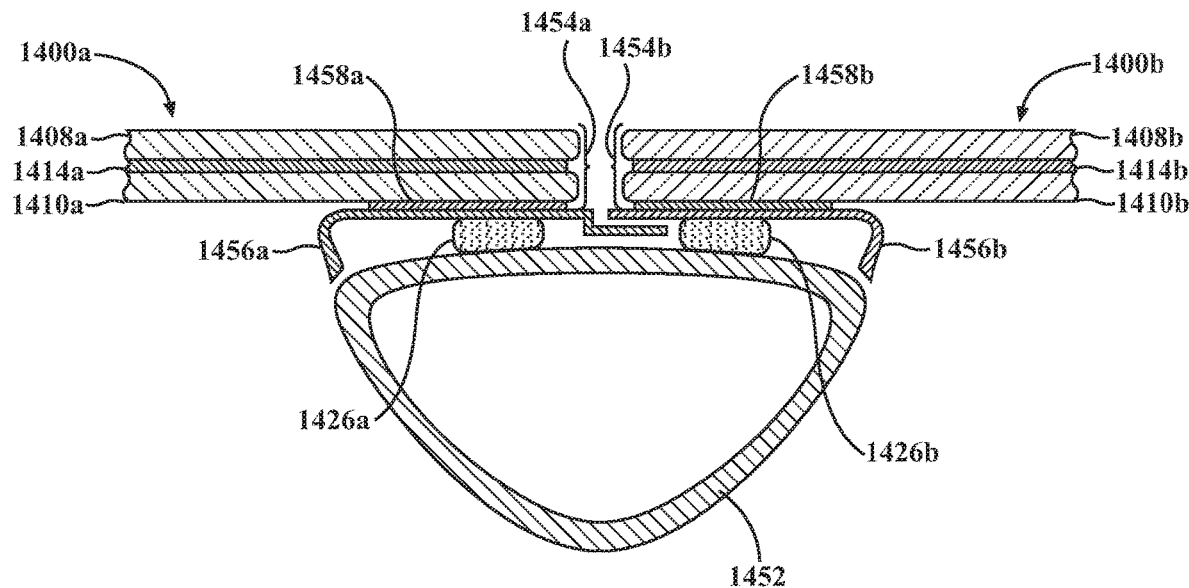
FIG. 14 shows a sectional view of the sealing juncture of FIG. 12 with overlapping covers adhered to the glass for adhesion to the support structure.

FIG. 14 shows a sectional view of the sealing juncture of FIG. 12 with overlapping covers 1456a,b adhered to glass portions 1400a,b for adhesion to an underlying support structure 1452. The sealing juncture can include two glass portions 1400a,b having first glass panes 1408a,b, second glass panes 1410a,b, and interlayers 1414a,b. Though shown as laminated glass portions 1400a,b, other forms of glass or other transparent materials are also possible. Thin, transparent adhesive layers 1458a,b can be applied to exterior surfaces of the glass portions 1400a,b in order to secure the covers 1456a,b to the glass portions 1400a,b. The transparent adhesive layers 1458a,b can be designed with little or no compliance in order to rigidly secure the covers 1456a,b to the glass portions 1400a,b.

The covers 1456a,b in the example of FIG. 14 are elongated panels having opposing surfaces, the first surfaces being secured to the transparent adhesive layers 1458a,b, and the second or opposing surfaces being configured to receive compliant adhesive layers 1426a,b similar to the adhesive layers 1326a,b described in reference to FIG. 13. The covers 1456a,b can be shaped in variety of ways or formed from a variety of materials, such as plastic, steel, aluminum, or composite, so as to create a desired visual effect when viewed from either side of the glass portions 1400a,b. The covers 1456a,b are designed to extend beyond outer edges 1454a,b of the glass portions 1400a,b when secured by the transparent adhesive layers 1458a,b to obscure the support structure 1452 from view through one side of the glass portions 1400a,b.

Once the compliant adhesive layers 1426a,b are applied to the covers 1456a,b, the glass portions 1400a,b can be positioned such that the extending portions of the covers 1456a,b either meet or overlap, and the combination of the glass portions 1400a,b and the covers 1456a,b can be compressed against the support structure 1452 to complete the sealing juncture. When the glass portions 1400a,b are secured to the support structure 1452, the covers 1456a,b extend from opposing edges of the support structure 1452 to positions beyond the outer edges 1454a,b of the glass portions 1400a,b, completely obscuring the compliant adhesive layers 1426a,b from view from either side of the glass portions 1400a,b.

Figure 15:
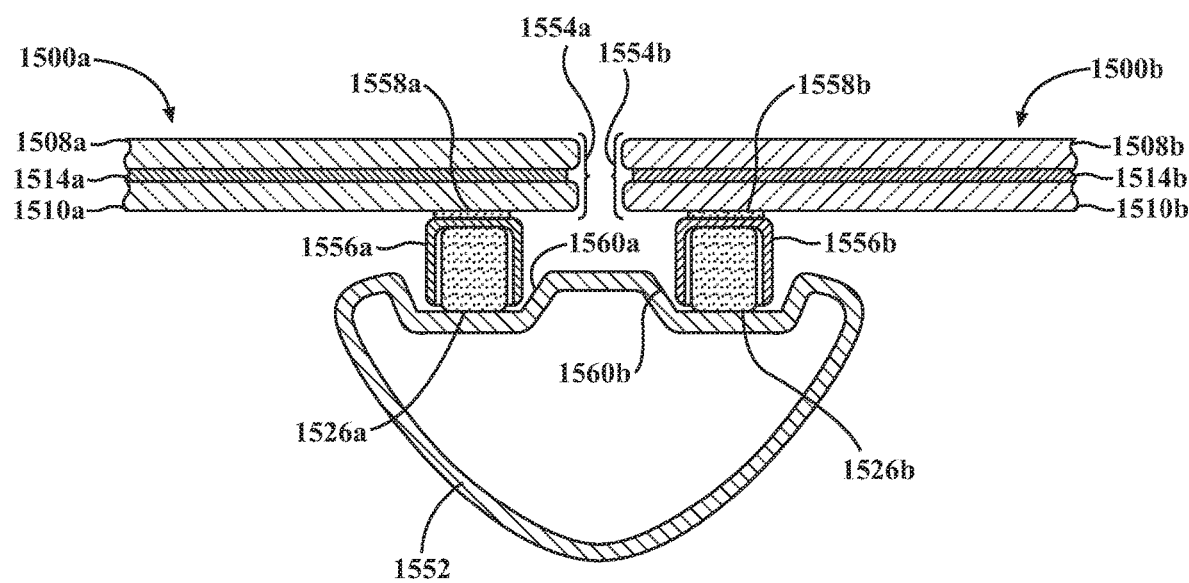
FIG. 15 shows a sectional view of the sealing juncture of FIG. 12 with spaced covers adhered to the glass for adhesion to the support structure.

FIG. 15 shows a sectional view of the sealing juncture of FIG. 12 with spaced covers 1556a,b adhered to glass portions 1500a,b for adhesion to an underlying support structure 1552. The sealing juncture can include two glass portions 1500a,b having first glass panes 1508a,b, second glass panes 1510a,b, and interlayers 1514a,b. Though shown as laminated glass portions 1500a,b, other forms of glass or other transparent materials are also possible. Transparent adhesive layers 1558a,b can be applied to exterior surfaces of the glass portions 1500a,b in order to secure the covers 1556a,b to the glass portions 1500a,b. The transparent adhesive layers 1558a,b can be designed to be thin, with little or no compliance, or to be thicker, having some compliance. In either design, the transparent adhesive layers 1558a,b can firmly secure the covers 1556a,b to the glass portions 1500a,b.

The covers 1556a,b in the example of FIG. 15 are c-shaped channels having opposing surfaces, the first surfaces being secured to the transparent adhesive layers 1558a,b, and the second or opposing surfaces being configured to receive compliant adhesive layers 1526a,b. The shape of the covers 1556a,b allows the channels to be filled with the compliant adhesive layers 1526a,b. The support structure 1552 can be designed with recesses 1560a,b configured to receive the covers 1556a,b filled with the compliant adhesive layers 1526a,b, that is, the covers 1556a,b can be inserted, at least partially, within the recesses 1560a,b in the support structure 1552. To secure the glass portions 1500a,b to the support structure 1552, the compliant adhesive layers 1526a,b that fill the channels in the covers 1556a,b can be compressed against bottom surfaces of the recesses 1560a,b in the support structure 1552.

Though the covers 1556a,b in FIG. 15 are shown as protruding slightly from the recesses 1560a,b when the sealing juncture is complete, the covers 1556a,b can be designed to be flush with the top of the recesses 1560a,b or to protrude further from the recesses 1560a,b when installed. In any of these configurations, the covers 1556a,b can completely obscure the compliant adhesive layers 1526a,b from view while at the same time providing a striped visual effect when viewed from one side of the glass portions 1500a,b. The location of the recesses 1560a,b in the support structure 1552 can modify the visual effect. Additionally, the recesses 1560a,b can be shaped such that the compliant adhesive layer 1526a,b can be removed when necessary, for example, using a thin angled tool, such as a vehicle trim tool in the case where the support structure 1552 is a vehicle pillar.

Figure 16:
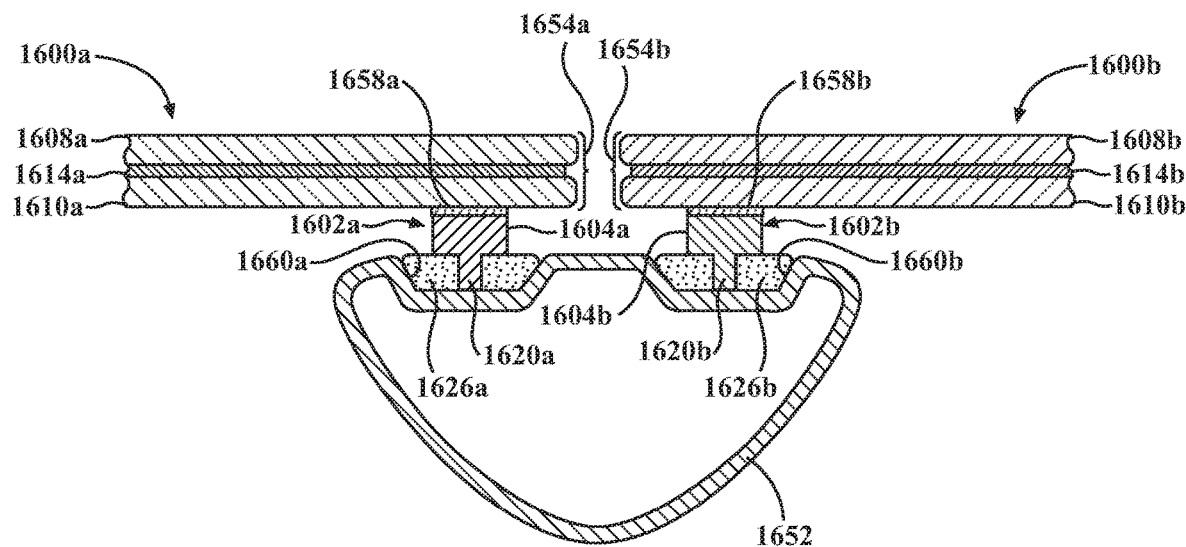
FIG. 16 shows a sectional view of the sealing juncture of FIG. 12 with fasteners extending from the laminated glass into the support structure.

FIG. 16 shows a sectional view of the sealing juncture of FIG. 12 with fasteners 1602*a,b* extending from glass portions 1600*a,b* into a support structure 1652. The sealing juncture can include two glass portions 1600*a,b* having first glass panes 1608*a,b*, second glass panes 1610*a,b*, and interlayers 1614*a,b*. Though shown as laminated glass portions 1600*a,b*, other forms of glass or other transparent materials are also possible. Transparent adhesive layers 1658*a,b* can be applied to exterior surfaces of the glass portions 1600*a,b* in order to secure first portions 1604*a,b* of the fasteners 1602*a,b* to the glass portions 1600*a,b*. The transparent adhesive layers 1658*a,b* can be designed to be thin, with little or no compliance, in order to rigidly secure the first portions 1604*a,b* to the glass portions 1600*a,b*.

The fasteners 1602*a,b* in the example of FIG. 16 include both the first portions 1604*a,b* secured to the transparent adhesive layers 1658*a,b* and second portions 1620*a,b* extending from the respective first portions 1604*a,b* away from the transparent adhesive layers 1658*a,b*. The support structure 1652 can be designed with bores or recesses 1660*a,b* configured to receive the second portions 1620*a,b* of the fasteners 1602*a,b*. In one embodiment, the recesses 1660*a,b* in the support structure 1652 can be filled with compliant adhesive layers 1626*a,b* configured to receive the second portions 1620*a,b* of the fasteners 1602*a,b* in order to secure the glass portions 1600*a,b* to the support structure 1652. In another embodiment (not shown) the recesses 1660*a,b* can include other forms of retainers, such as bushings, configured to receive the second portions 1620*a,b* of the fasteners 1602*a,b*.

The first portions 1604*a,b* of the fasteners 1602*a,b* can be visible through the glass portions 1600*a,b* and can be shaped or styled such that the second portions 1620*a,b* of the fasteners 1602*a,b* as well as the compliant adhesive layers 1626*a,b* are obscured when viewed from one side of the glass portions 1600*a,b*. The location of the fasteners 1602*a,b* adhered to the glass portions 1600*a,b* and the location of the recesses 1660*a,b* in the support structure 1652 can be changed to modify the visual effect. The recesses 1660*a,b* can be shaped such that the compliant adhesive layers 1526*a,b*, and in turn, the second portions 1620*a,b* of the fasteners 1602*a,b* can be removed when necessary, for example, using a thin angled tool, such as a vehicle trim tool.

Figure 17:
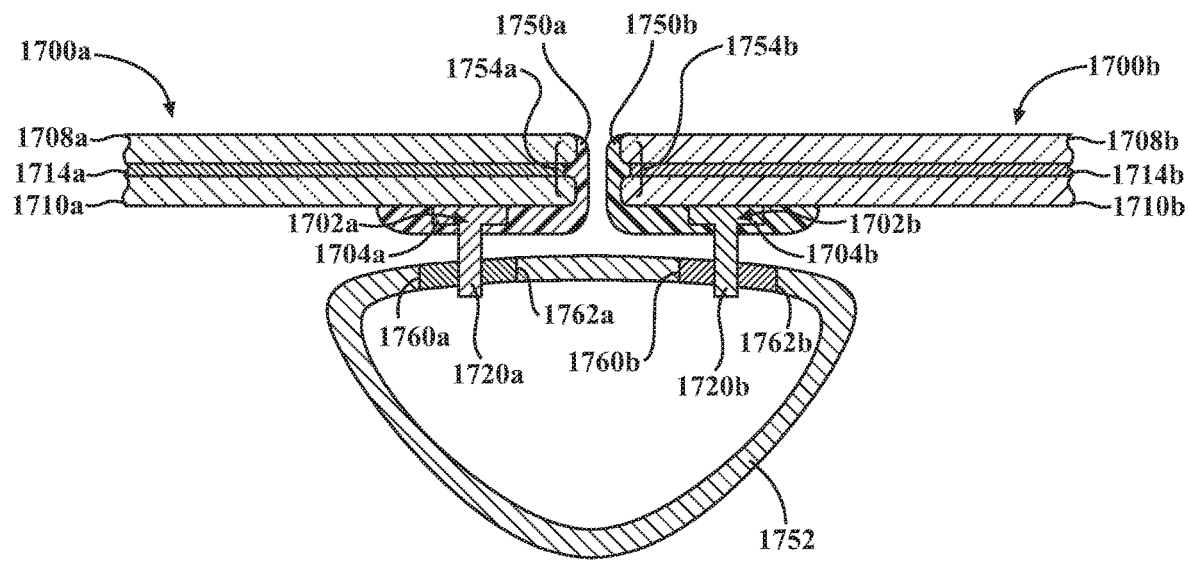
FIG. 17 shows a sectional view of the sealing juncture of FIG. 12 with fasteners extending from an overmold into the support structure.

FIG. 17 shows a sectional view of the sealing juncture of FIG. 12 with fasteners 1702*a,b* extending from overmolds 1750*a,b* into a support structure 1752. The sealing juncture can include two glass portions 1700*a,b* having first glass panes 1708*a,b*, second glass panes 1710*a,b*, and interlayers 1714*a,b*. Though shown as laminated glass portions 1700*a, b*, other forms of glass or other transparent materials are also possible. The overmolds 1750*a,b* can be applied, for example, using an encapsulation process, to edges 1754*a,b* of the glass portions 1700*a,b*. The overmolds 1750*a,b* can be designed to secure first portions 1704*a,b* of the fasteners 1702*a,b* to the glass portions 1700*a,b* and create a visual feature along the edges 1754*a,b*.

The fasteners 1702*a,b* in the example of FIG. 17 include both the first portions 1704*a,b* embedded or captured within the overmolds 1750*a,b* and second portions 1720*a,b* extending perpendicularly from the first portions 1704*a,b* out of the overmolds 1750*a,b*. The support structure 1752 can be designed with bores or recesses 1760*a,b* configured to receive the second portions 1720*a,b* of the fasteners 1702*a, b*. In the example of FIG. 17, the recesses 1760*a,b* can be designed to hold or receive retainers, such as bushings 1762*a,b*, configured to capture the second portions 1720*a,b* of the fasteners 1702*a,b*. Though the retainers shown are bushings 1762*a,b*, other forms of retainers such as clips, adhesives, or clamps are also possible.

The first portions 1704*a,b* of the fasteners 1702*a,b* can be visible through the glass portions 1700*a,b* and can be positioned within the overmolds 1750*a,c* as desired to modify the visual effect of the fasteners 1702*a,b*. The interface between the overmolds 1750*a,b* and the support structure 1752 can be designed such that the second portions 1720*a,b* of the fasteners 1702*a,b* can be removed from the support structure 1752 when necessary, for example, by designing a gap between the overmolds 1750*a,b* and the support structure 1752 when the fasteners 1702*a,b* are secure. In the embodiment shown in FIG. 17, the fasteners 1702*a,b* are located at discrete points within the overmold 1750*a,b*. In an alternative embodiment (not shown), the second portions 1720*a,b* of the fasteners 1702*a,b* can be located at discrete points while the first portions 1704*a,b* of the fasteners 1702*a,b* are formed as strips or bars, creating a striped effect when viewed through the glass portions 1700*a,b*.

Figure 18:
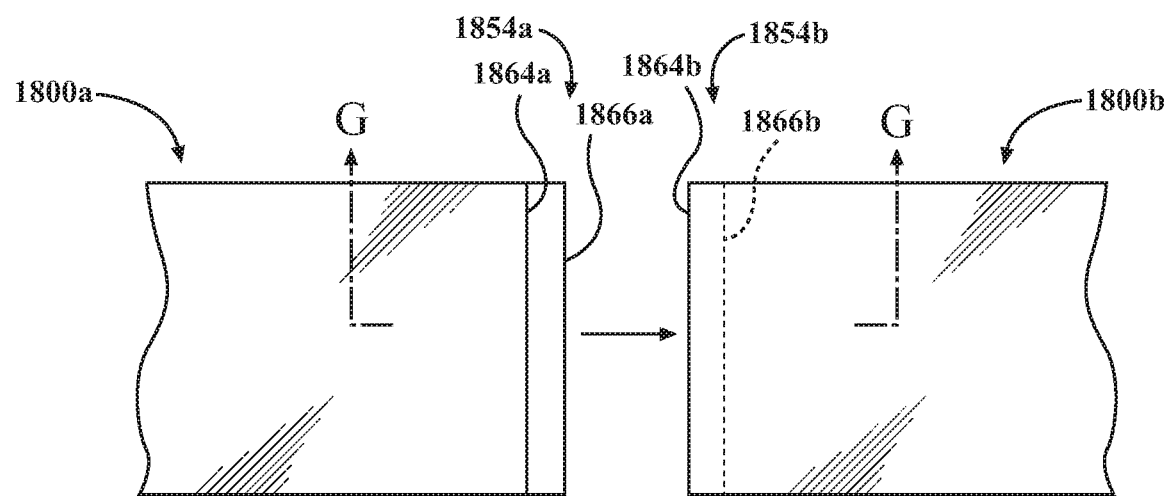
FIG. 18 shows a top view of another sealing juncture for two portions of laminated glass with at least one portion movable in respect to the other portion.

FIG. 18 shows a top view of another sealing juncture for two glass portions 1800*a,b* with one glass portion 1800*a* movable in respect to the other glass portion 1800*b*. The glass portions 1800*a,b* include first edge portions 1864*a,b* and second edge portions 1866*a,b* that are offset from the first edge portions 1864*a,b*. The sealing juncture is designed such that the when the glass portion 1800*a* moves toward the glass portion 1800*b*, the first edge portions 1864*a,b* align and the second edge portions 1866*a,b* align when the two glass portions 1800*a,b* are brought together, for example, in the case of a moving window in the door of a vehicle. A section, G-G, is shown as extending through the glass portions 1800*a,b* in the sealing system. Various sectional views through section G-G for a variety of sealing systems are described in conjunction with FIGS. 19-20 below.

Figure 19:
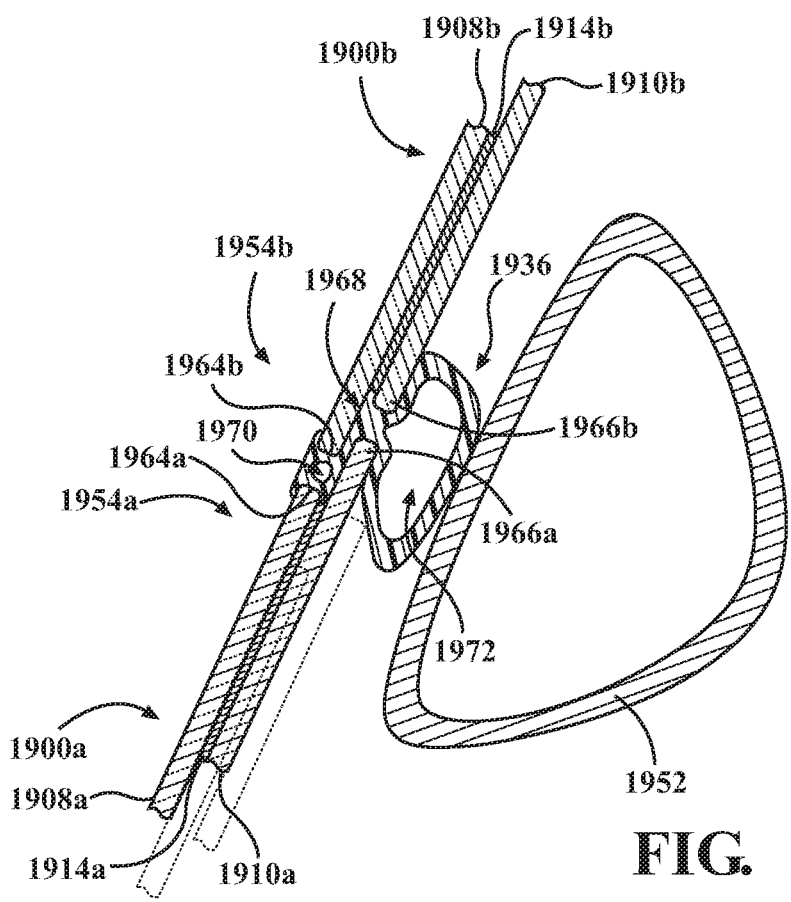
FIG. 19 shows a sectional view of the sealing juncture of FIG. 18 with an overmolded seal disposed on one of the glass portions.

FIG. 19 shows a sectional view of the sealing juncture of FIG. 18 with an overmolded seal 1936 disposed between glass portions 1900*a,b*. Each of the glass portions 1900*a,b* in FIG. 19 includes a first glass pane 1908*a,b*, a second glass pane 1910*a,b*, an interlayer 1914*a,b* disposed between the first and second glass panes 1908*a,b*, 1910*a,b*, and edges 1954*a,b* defining first edge portions 1964*a,b* offset from second edge portions 1966*a,b*. The offset of the first edge portion 1964*a* and the second edge portion 1966*a* is in the opposite direction from the offset of the first edge portion 1964*b* and the second edge portion 1966*b* such that the two glass portions 1900*a,b* can align in an interlocking manner when one moves toward the other. The offset is beneficial, for example, in situations where pressure differentials inside and outside of the sealing juncture pull the edges 1954*a,b* of the glass portions 1900*a,b* apart, such as in a vehicle traveling at higher speeds.

The seal 1936 in FIG. 19 can include an overmold portion 1968 that captures the first edge portion 1964*b* and the second edge portion 1966*b* of the glass portion 1900*b*, for example, by encapsulation. The seal 1936 can also include a compressible portion that extends from the overmold portion 1968. In this example, the compressible portion includes a first bulb portion 1970 configured to sealingly engage the first edge portions 1964*a,b* of the glass portions 1900*a,b* under compression and a second bulb portion 1972 configured to sealingly engage the second edge portions 1966*a,b* of the glass portions 1900*a,b* and the support structure 1952 under compression. In operation of the sealing system of FIG. 19, the glass portions 1900a,b can be sealed against the support structure 1952 by sliding the glass portion 1900a toward the glass portion 1900b. Once slid together, the first edge portion 1964a of the glass portion 1900a engages the first bulb portion 1970 and the second edge portion 1966a of the glass portion 1900a engages the second bulb portion 1972. The second bulb portion 1972 is compressed in a manner which in turn engages the support structure 1952 as shown.

Figure 20:
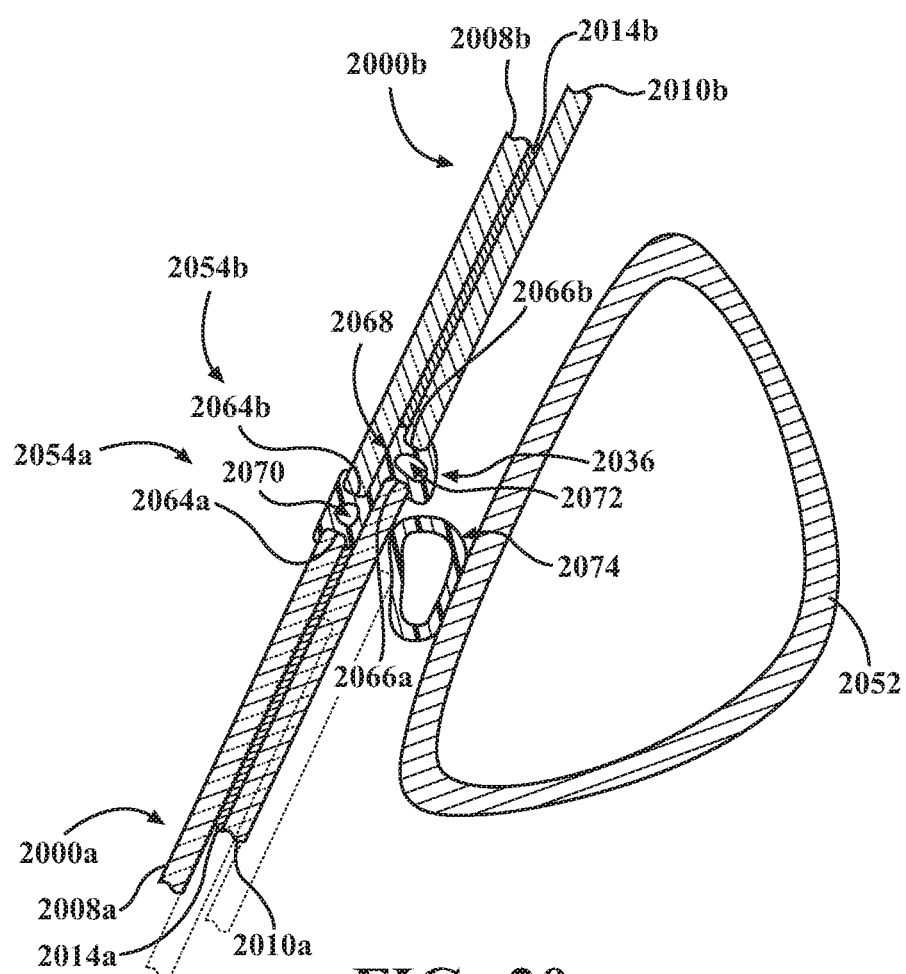
FIG. 20 shows a sectional view of the sealing juncture of FIG. 19 with another overmolded seal disposed on one of the glass portions.

FIG. 20 shows a sectional view of the sealing juncture of FIG. 18 with another overmolded seal 2036 disposed between glass portions 2000a,b. Each of the glass portions 2000a,b in FIG. 20 includes a first glass pane 2008a,b, a second glass pane 2010a,b, an interlayer 2014a,b disposed between the first and second glass panes 2008a,b, 2010a,b, and edges 2054a,b defining first edge portions 2064a,b offset from second edge portions 2066a,b. The offset of the first edge portion 2064a and the second edge portion 2066a is in the opposite direction from the offset of the first edge portion 2064b and the second edge portion 2066b such that the two glass portions 2000a,b can align in an interlocking manner when one moves toward the other, as was described in reference to FIG. 19.

The seal 2036 in FIG. 20 can include an overmold portion 2068 that captures the first edge portion 2064b and the second edge portion 2066b of the glass portion 2000b, for example, by encapsulation. The seal 2036 can also include a pair of compressible portions that extend from the overmold portion 2068. In this example, a first bulb portion 2070 is configured to sealingly engage the first edge portions 2064a,b of the glass portions 2000a,b under compression and a second bulb portion 2072 is configured to sealingly engage the second edge portions 2066a,b of the glass portions 2000a,b under compression. To guide the glass portions 2000a,b together and to seal the glass portions 2000a,b to the support structure 2052, the sealing system includes another seal 2074 disposed on the support structure 2052. In operation, the glass portions 2000a,b can be sealed against the support structure 2052 by sliding the glass portion 2000a toward the glass portion 2000b. Once slid together, the first edge portion 2064a of the glass portion 2000a engages the first bulb portion 2070 and the second edge portion 2066a engages the second bulb portion 2072. The second glass pane 2010a also compresses the seal 2074 attached to the support structure 2052.

What is claimed is:

1. A glass fastening system, comprising:
   a first glass pane;
   a second glass pane defining a first bore;
   an interlayer disposed between and extending along interior surfaces of the first glass pane and the second glass pane and defining a second bore axially aligned with the first bore;
   a fastener having a first portion disposed within the second bore of the interlayer between the first glass pane and the second glass pane, a second portion extending through the first bore and outward from an exterior surface of the second glass pane, and a third portion configured to engage the second portion of the fastener outside the exterior surface of the second glass pane,
      wherein the first portion of the fastener anchors the fastener between the first glass pane and the second glass pane, and
      wherein the second portion of the fastener comprises a male portion and the third portion of the fastener comprises a female portion; and
   a conductive layer disposed within the second bore between the first glass pane and the first portion of the fastener,
      wherein the conductive layer is configured to transmit electricity through the fastener, and
      wherein the conductive layer fills the second bore in the interlayer to form a continuous surface with the interlayer and cover an entire surface of the first portion of the fastener.

2. The system of claim 1, wherein the interlayer includes at least one of a pressure-based adhesive and a thermally-activated adhesive configured to join the first glass pane and the second glass pane, sandwiching the first portion of the fastener.

3. The system of claim 1, further comprising:
   a compliant layer disposed between the first portion of the fastener and the second glass pane.

4. The system of claim 1, wherein the second portion of the fastener is directly coupled to the first portion.

5. The system of claim 1, wherein one of the first and second portions is magnetically attractable to the other of the first and second portions.

6. The system of claim 1, wherein the second glass pane defines a relief portion surrounding the first bore that is axially aligned with the first bore and the second bore, and wherein the first portion of the fastener is disposed within the relief portion.

7. The system of claim 6, further comprising:
   a compliant layer disposed within the relief portion of the second glass pane and defining a third bore aligned with the first bore, wherein the first portion of the fastener extends through the third bore.

8. The system of claim 1, wherein the conductive layer is configured to collect solar energy.

9. The system of claim 8, wherein the conductive layer is configured to use the collected solar energy to transmit electricity to power devices that are part of the fastener, and wherein the devices include at least one of lights or sensors.

10. The system of claim 1, wherein the second portion of the fastener is configured to directly couple the first and second glass panes to a vehicle structure, and wherein the vehicle structure is at least one of a vehicle pillar or door frame.

11. A glass fastening system, comprising:
   a first glass pane;
   a second glass pane defining a relief portion and a first bore disposed within and axially aligned with the relief portion;
   an interlayer disposed between the first glass pane and the second glass pane and defining a second bore axially aligned with the relief portion and the first bore;
   a fastener having a first portion disposed within the relief portion and a second portion extending from the first portion, through the first bore, and outward from an exterior surface of the second glass pane; and
   a conductive layer disposed within the second bore between the first glass pane and the first portion of the fastener, the conductive layer configured to transmit electricity through the fastener, fill the second bore in the interlayer, and cover an entire surface of the first portion of the fastener.

12. The system of claim 11, further comprising:
   a compliant layer disposed within the relief portion of the second glass pane between the first portion of the fastener and the second glass pane.

13. The system of claim 11, wherein the conductive layer is configured to transmit electricity to the first portion of the fastener to power devices that are part of the fastener, and wherein the devices include at least one of lights or sensors.

14. The system of claim 11, wherein the second portion of the fastener is directly coupled to the first portion and comprises a male portion.

15. The system of claim 14, wherein the fastener has a third portion configured to engage the second portion of the fastener outside the exterior surface of the second glass pane, and wherein the third portion comprises a female portion.

16. A glass fastening system, comprising:
a first glass pane;
a second glass pane defining a recessed portion;
an interlayer disposed between and extending along interior surfaces of the first glass pane and the second glass pane and defining a bore axially aligned with the recessed portion, wherein the recessed portion and the bore in the interlayer have equal cross-sectional areas perpendicular to the axis of alignment;
a fastener having a first portion disposed within the recessed portion of the second glass pane, wherein the first portion anchors the fastener between the first glass pane and the second glass pane, and a second portion extending outward from an exterior surface of the second glass pane, wherein the second portion comprises a male portion; and
a conductive layer disposed within the bore, extending between the first glass pane and the first portion of the fastener, and covering an entire surface of the first portion of the fastener,
wherein the conductive layer is configured to collect energy and transmit electricity to the first portion of the fastener to power devices that are part of the fastener, and
wherein the conductive layer and the interlayer form a continuous surface with the conductive layer filling the bore in the interlayer.

17. The system of claim 11, wherein one of the first and second portions is magnetically attractable to the other of the first and second portions.

18. The system of claim 16, wherein the second portion of the fastener is configured to directly couple the first and second glass panes to a vehicle structure, and wherein the vehicle structure is at least one of a vehicle pillar or door frame.

19. The system of claim 16, wherein the devices include at least one of lights or sensors.

20. The system of claim 16, wherein the bore is a first bore, wherein the second glass pane defines a second bore axially aligned with the first bore and the recessed portion, and wherein the second portion of the fastener is directly coupled to the first portion of the fastener and extends through the second bore and outward from the exterior surface of the second glass pane.

21. The system of claim 20, wherein the fastener has a third portion configured to engage the second portion of the fastener outside the exterior surface of the second glass pane, and wherein the third portion comprises a female portion.

22. The system of claim 16, wherein one of the first and second portions is magnetically attractable to the other of the first and second portions.

23. The system of claim 15, wherein connection of the second portion of the fastener to the third portion of the fastener is configured to couple the first and second glass panes to a vehicle structure, and wherein the vehicle structure is at least one of a vehicle pillar or door frame.

* * * * *